United States Patent
Wang et al.

(10) Patent No.: US 12,148,836 B2
(45) Date of Patent: *Nov. 19, 2024

(54) GATE-ALL-AROUND STRUCTURE AND METHODS OF FORMING THE SAME

(71) Applicant: Parabellum Strategic Opportunities Fund LLC, Wilmington, DE (US)

(72) Inventors: Pei-Hsun Wang, Hsinchu (TW); Chih-Hao Wang, Hsinchu County (TW); Chun-Hsiung Lin, Hsinchu (TW)

(73) Assignee: Parabellum Strategic Opportunities Fund LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,584

(22) Filed: Apr. 24, 2023

(65) Prior Publication Data
US 2023/0261114 A1 Aug. 17, 2023

Related U.S. Application Data

(63) Continuation of application No. 17/175,816, filed on Feb. 15, 2021, now Pat. No. 11,637,207, which is a (Continued)

(51) Int. Cl.
*H01L 29/786* (2006.01)
*H01L 21/02* (2006.01)
(Continued)

(52) U.S. Cl.
CPC .. *H01L 29/78618* (2013.01); *H01L 21/02236* (2013.01); *H01L 21/02532* (2013.01);
(Continued)

(58) Field of Classification Search
CPC ......... H01L 29/78618; H01L 21/02236; H01L 21/02532; H01L 21/02603;
(Continued)

(56) References Cited

U.S. PATENT DOCUMENTS 8,772,109 B2  7/2014  Colinge
8,785,285 B2  7/2014  Tsai et al.
(Continued)

*Primary Examiner* — J. E. Schoenholtz
(74) *Attorney, Agent, or Firm* — Almanac IP Advisors LLP

(57) ABSTRACT

Semiconductor device and the manufacturing method thereof are disclosed herein. An exemplary method comprises forming a fin over a substrate, wherein the fin comprises a first semiconductor layer and a second semiconductor layer including different semiconductor materials, and the fin comprises a channel region and a source/drain region; forming a dummy gate structure over the channel region of the fin and over the substrate; etching a portion of the fin in the source/drain region to form a trench therein, wherein a bottom surface of the trench is below a bottom surface of the second semiconductor layer; selectively removing an edge portion of the second semiconductor layer in the channel region such that the second semiconductor layer is recessed; forming a sacrificial structure around the recessed second semiconductor layer and over the bottom surface of the trench; and epitaxially growing a source/drain feature in the source/drain region of the fin.

20 Claims, 18 Drawing Sheets

Related U.S. Application Data continuation of application No. 16/511,176, filed on Jul. 15, 2019, now Pat. No. 10,923,598.

(60) Provisional application No. 62/771,627, filed on Nov. 27, 2018.

(51) Int. Cl.
| | |
|---|---|
| *H01L 21/306* | (2006.01) |
| *H01L 29/06* | (2006.01) |
| *H01L 29/423* | (2006.01) |
| *H01L 29/66* | (2006.01) |

(52) U.S. Cl.
CPC .. *H01L 21/02603* (2013.01); *H01L 21/30604* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC .......... H01L 21/30604; H01L 29/0673; H01L 29/42392; H01L 29/66545; H01L 29/66553; H01L 29/66742; H01L 29/78696; H01L 29/0847; H01L 29/1079; H01L 29/66439; H01L 29/66469; H01L 29/165; H01L 29/6653; H01L 29/6656; H01L 29/775; H01L 29/7848; H01L 21/823437; H01L 21/823431; H01L 21/823481; B82Y 10/00

See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,580,897 | B2 | 3/2020 | Pawlak |
| 10,872,953 | B2 | 12/2020 | Reznicek et al. |
| 11,121,233 | B2 | 9/2021 | Cheng et al. |
| 11,342,446 | B2 | 5/2022 | Guillorn et al. |
| 11,637,207 | B2 * | 4/2023 | Wang .................. H01L 29/6656 257/347 |
| 2015/0380313 | A1 | 12/2015 | Ching et al. |
| 2019/0189739 | A1 | 6/2019 | Li et al. |
| 2019/0198639 | A1 | 6/2019 | Kim et al. |
| 2019/0296127 | A1 | 9/2019 | Cheng et al. |
| 2019/0341316 | A1 | 11/2019 | Reznicek |
| 2019/0393306 | A1 | 12/2019 | Zhang et al. |
| 2020/0006569 | A1 | 1/2020 | Reznicek et al. |
| 2020/0013900 | A1 | 1/2020 | Carr et al. |
| 2020/0044087 | A1 | 2/2020 | Guha et al. |
| 2020/0075721 | A1 | 3/2020 | Li et al. |
| 2020/0083352 | A1 | 3/2020 | Chanemougame et al. |
| 2020/0105871 | A1 | 4/2020 | Glass et al. |
| 2020/0105929 | A1 | 4/2020 | Zhang et al. |

* cited by examiner

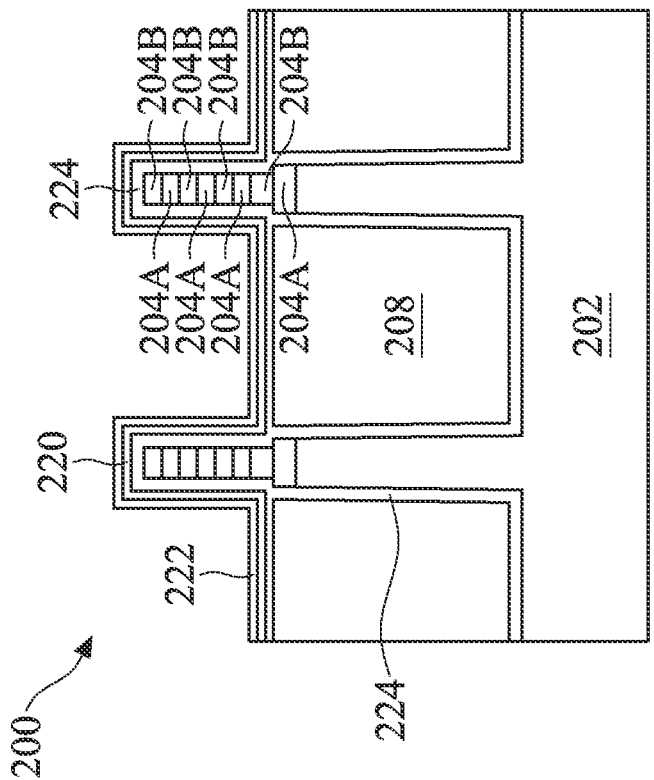
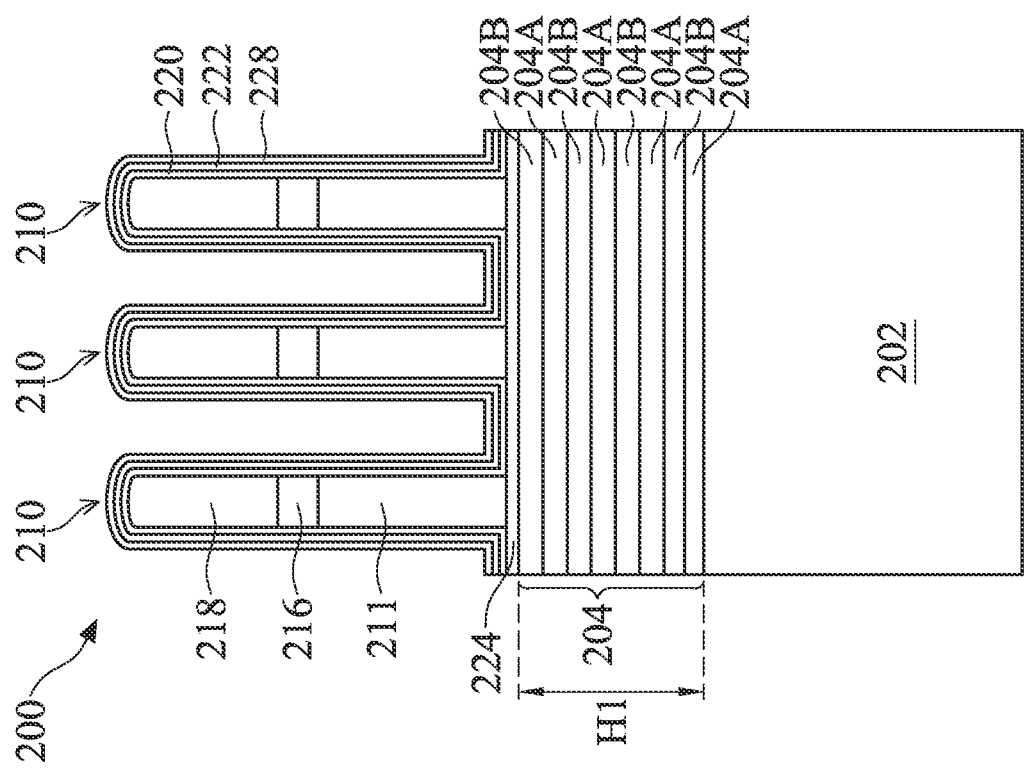
FIG. 3A
FIG. 3B

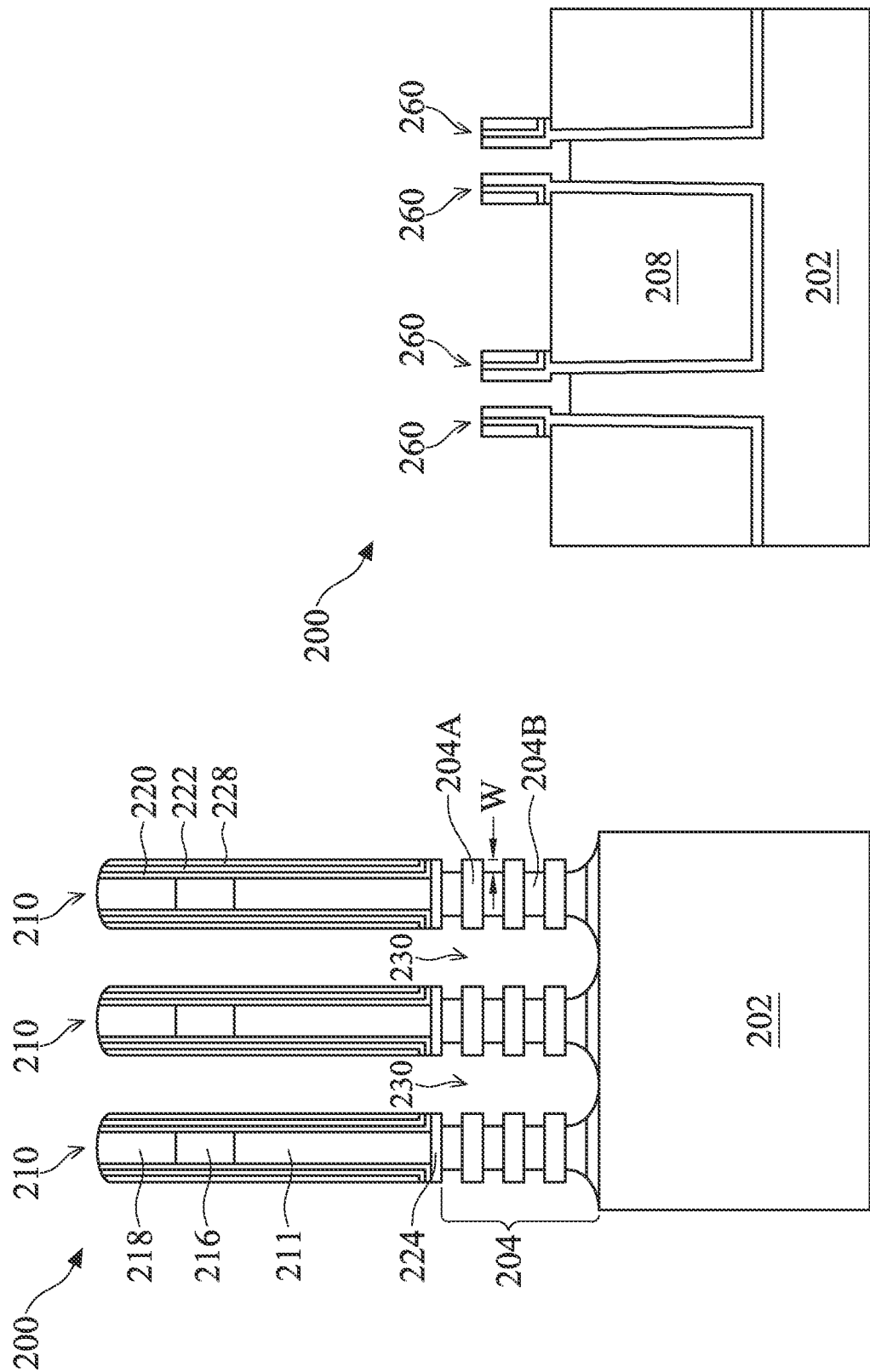

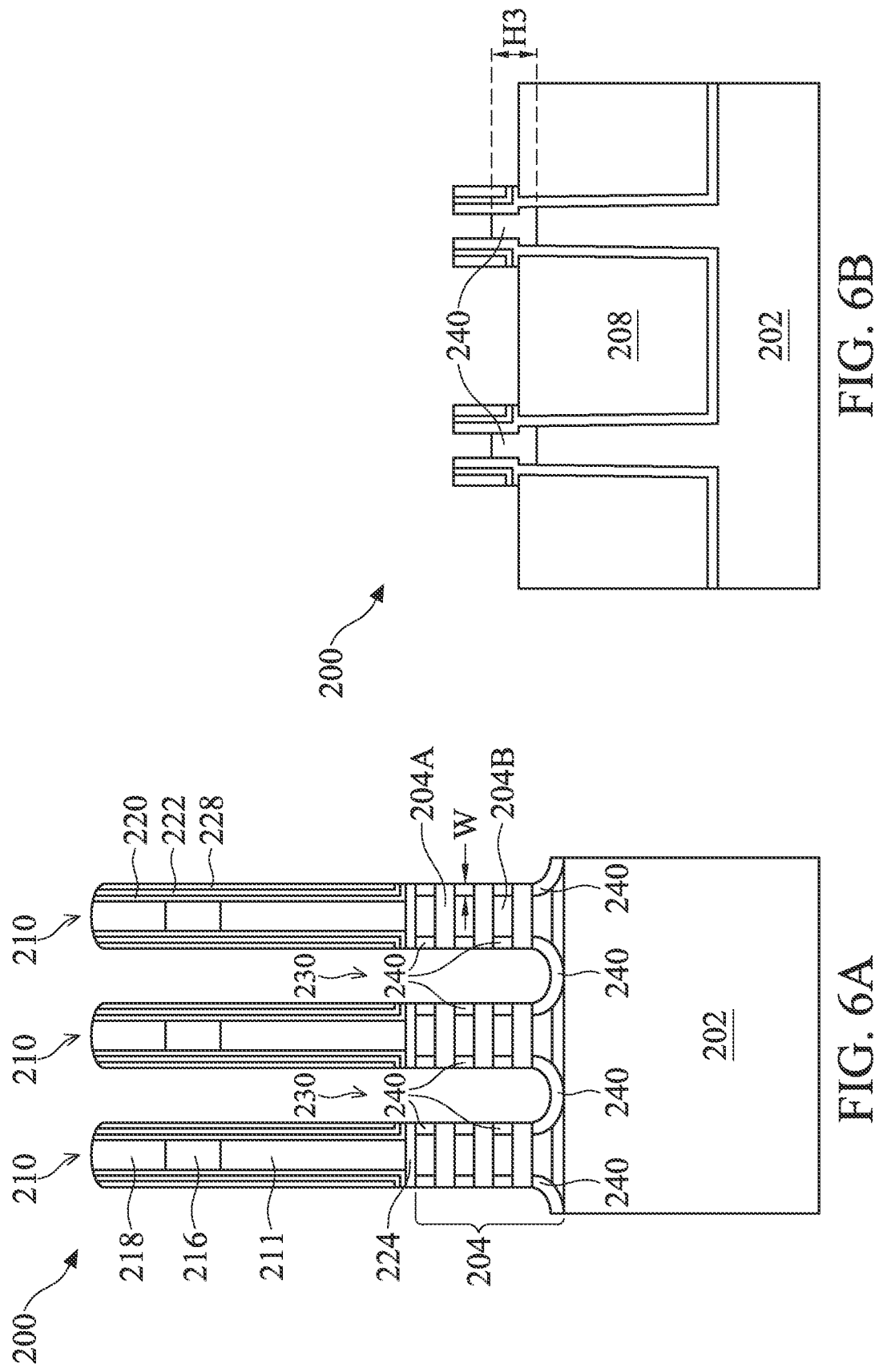

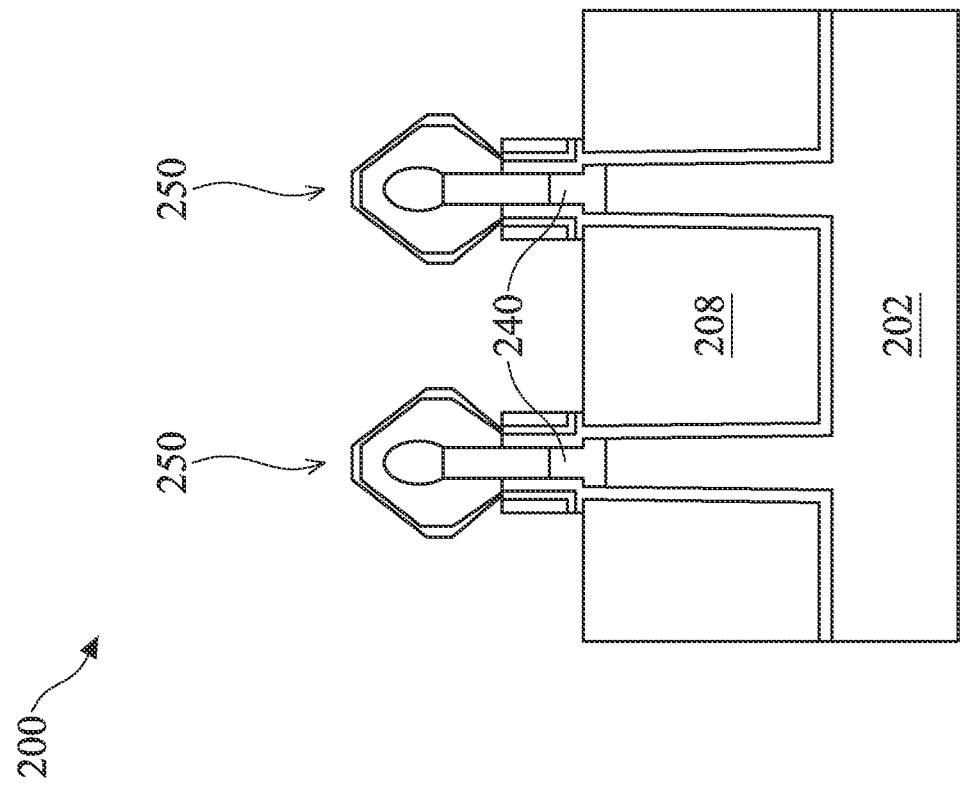
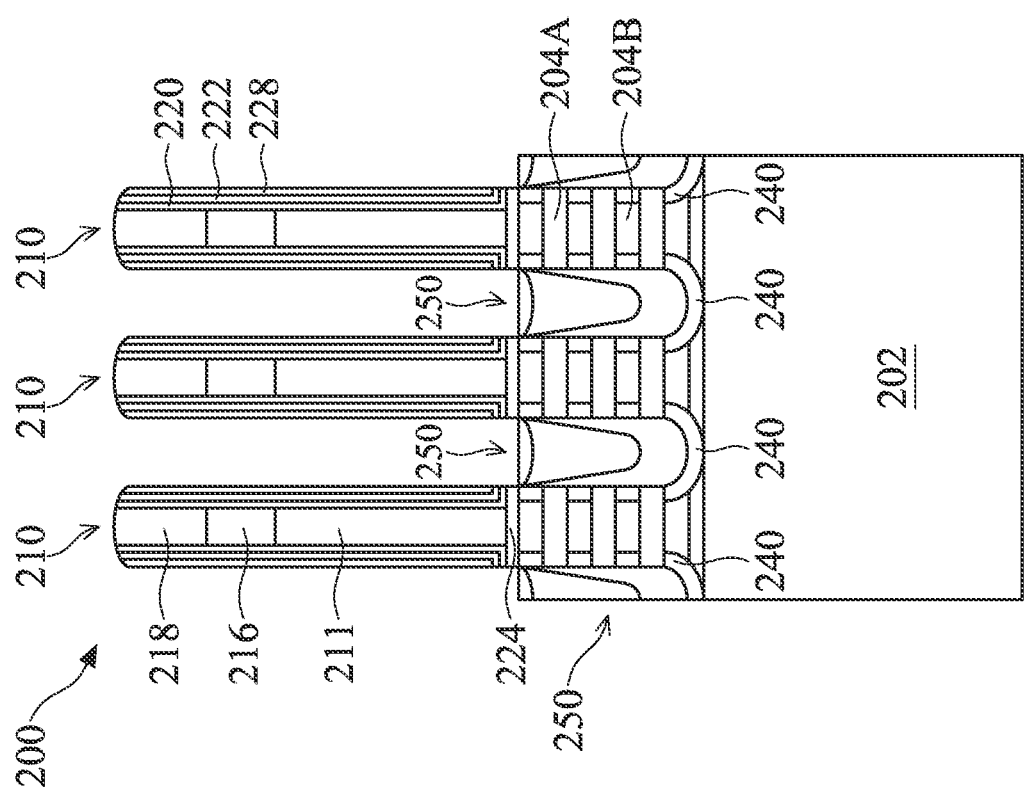
FIG. 7A
FIG. 7B

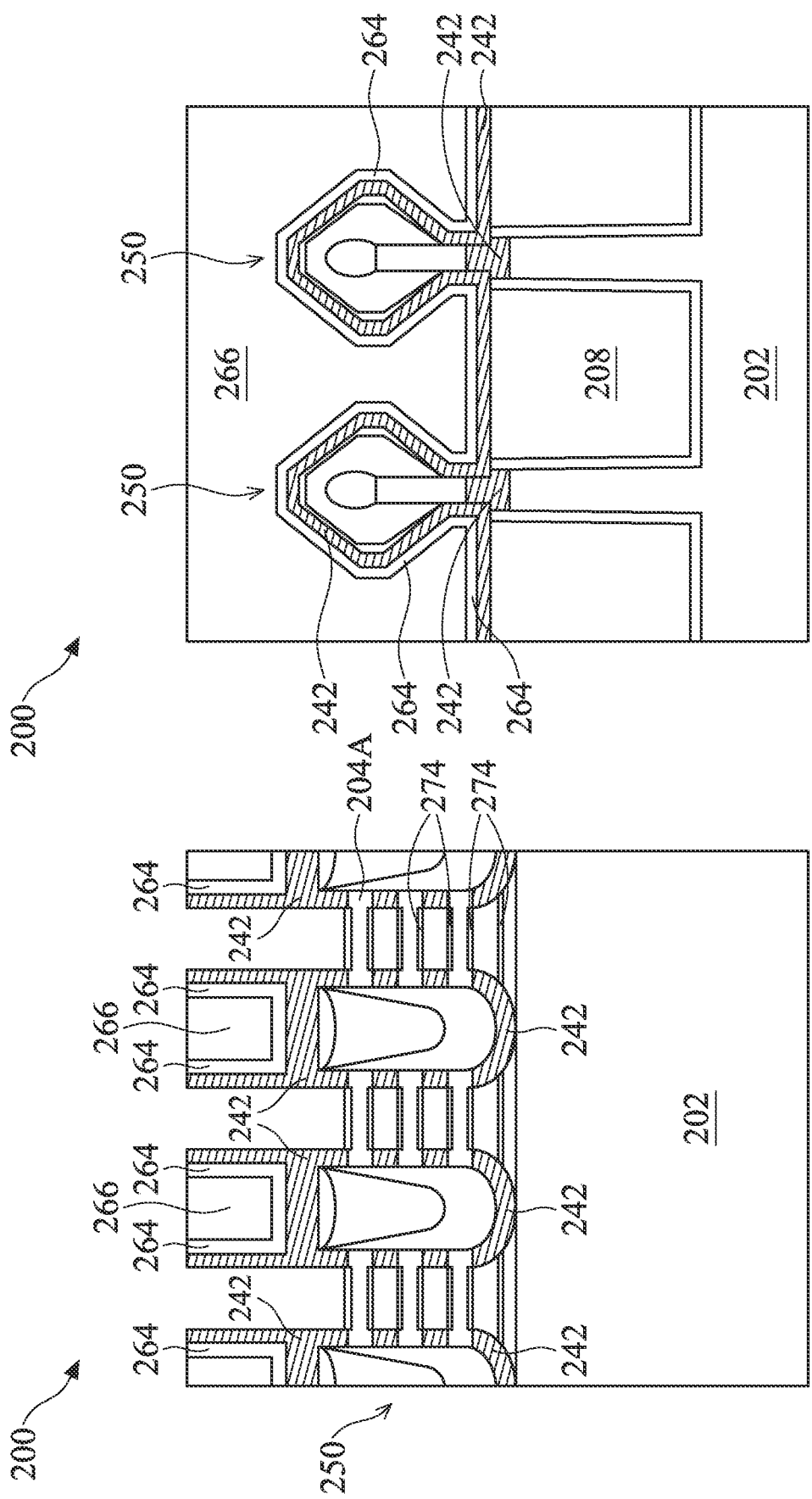

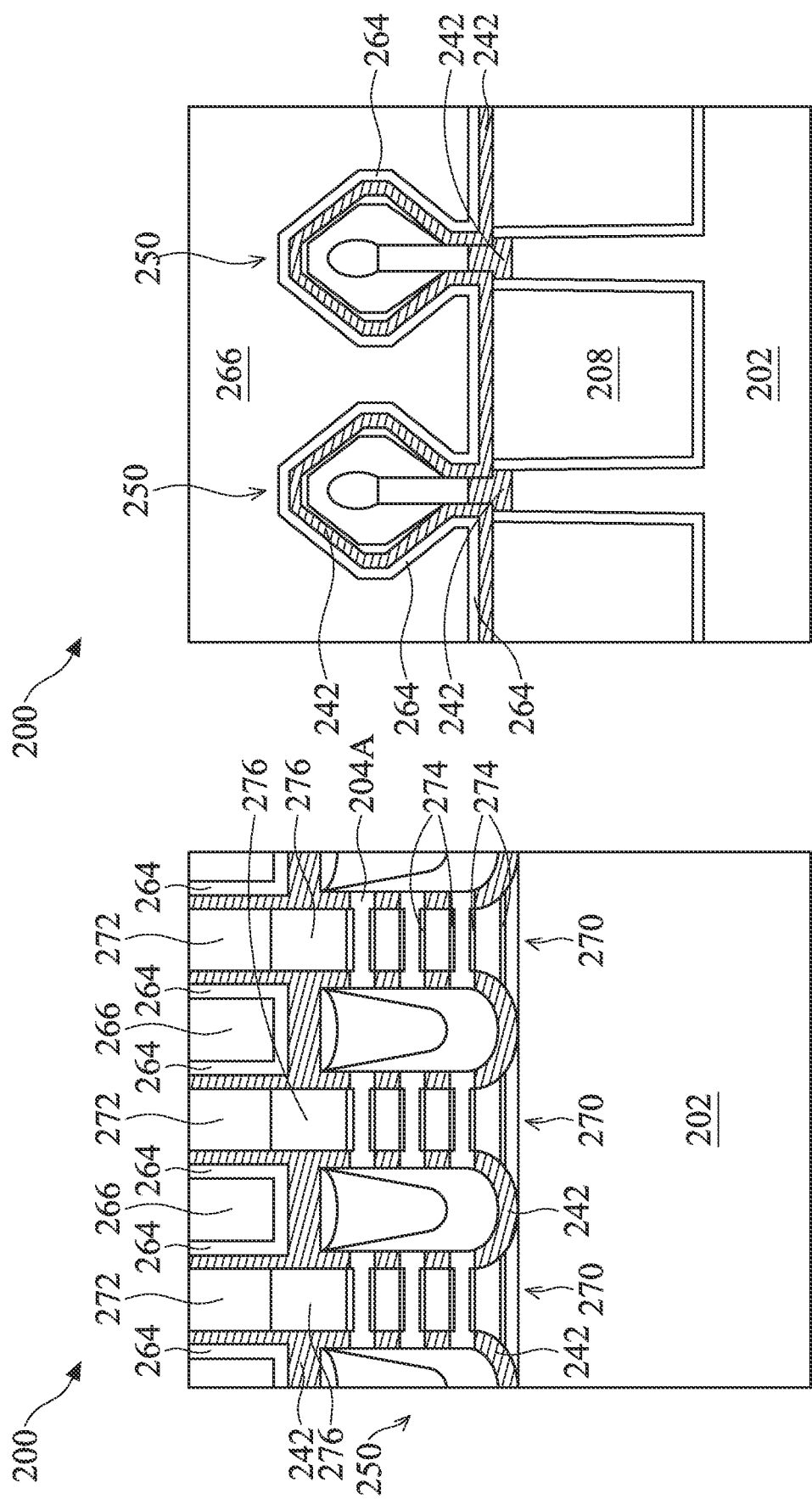

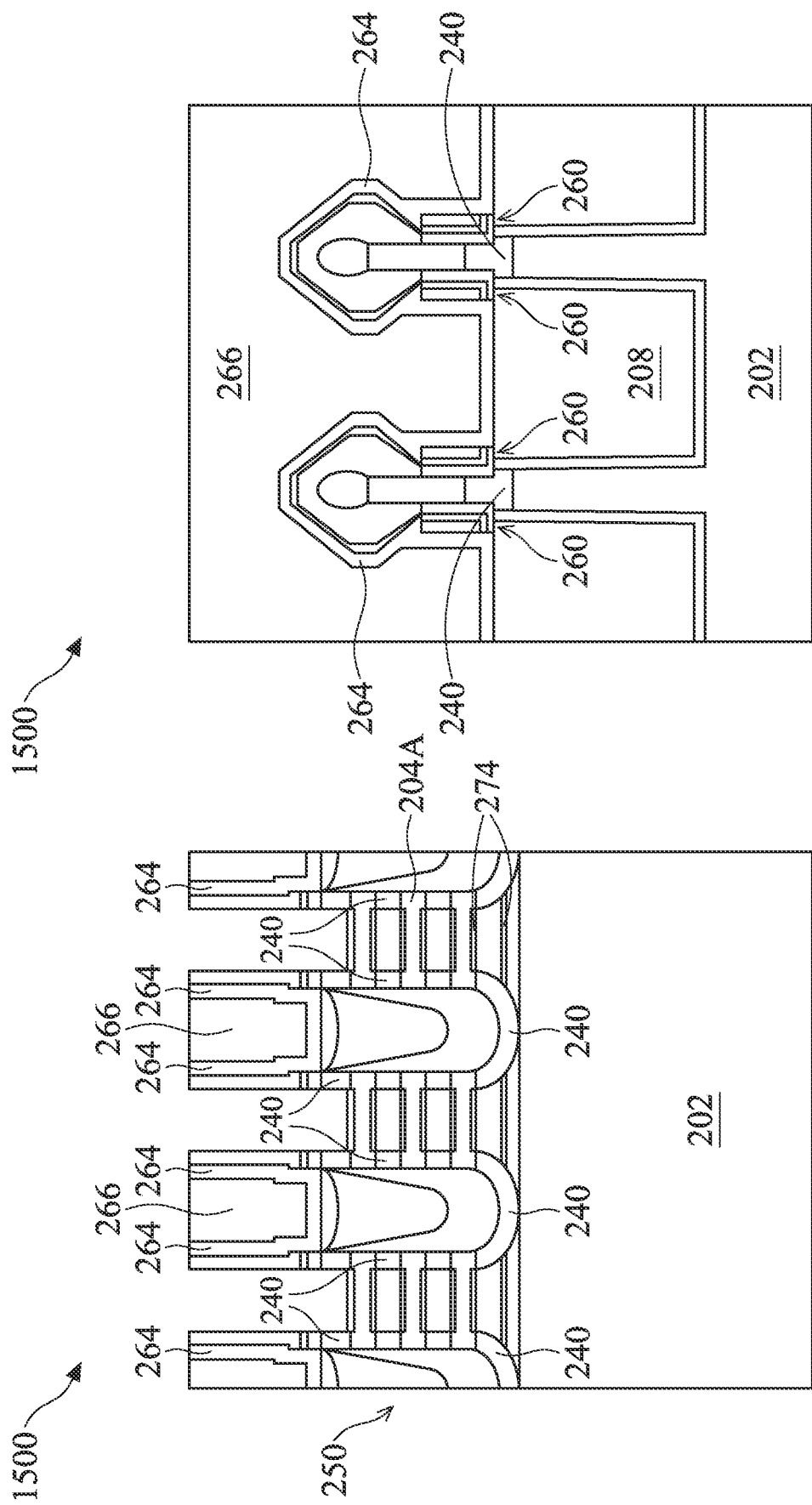

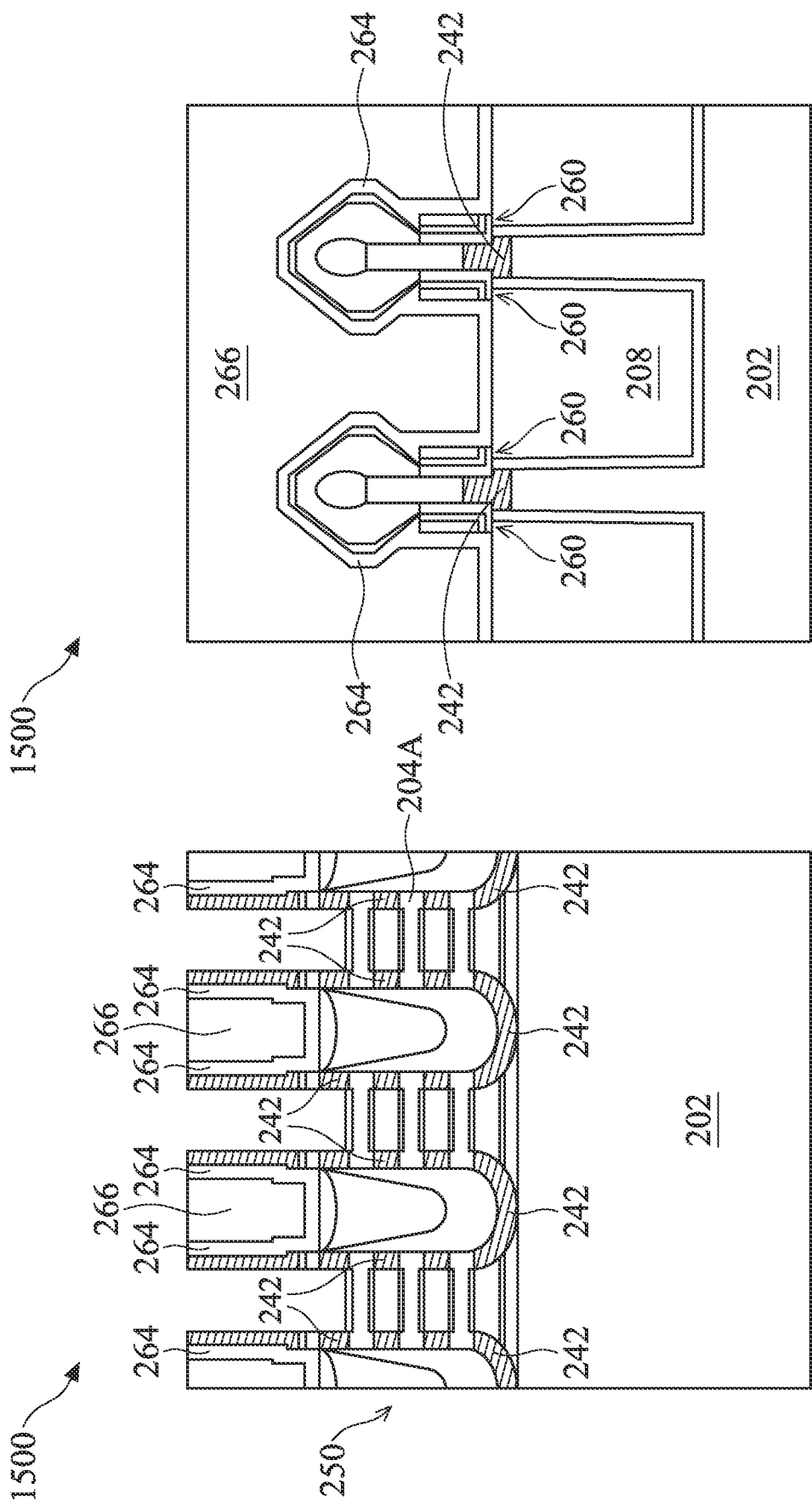

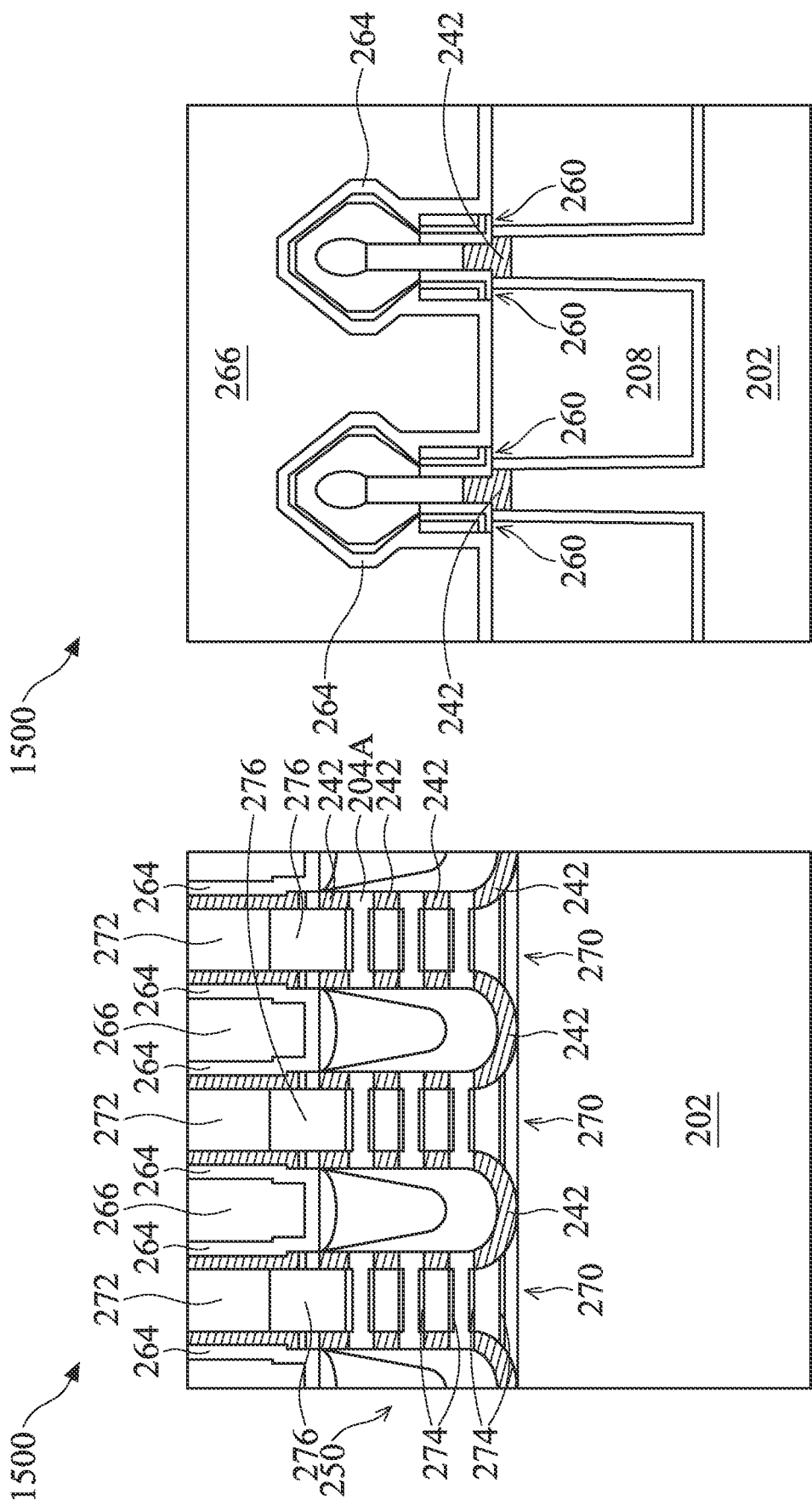

GATE-ALL-AROUND STRUCTURE AND METHODS OF FORMING THE SAME

PRIORITY DATA

The present application is a continuation application of U.S. application Ser. No. 17/175,816, filed Feb. 15, 2021, which is a continuation application of U.S. application Ser. No. 16/511,176, filed Jul. 15, 2019, which claims benefit of U.S. Provisional Patent Application No. 62/771,627, filed Nov. 27, 2018, each of which is incorporated herein by reference in its entirety.

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, in conventional GAA device, the epitaxial source/drain (S/D) structures directly contact the substrate. This may cause drain-induced-barrier-lowering (DIBL) issue and the result of DIBL is an increase of the residual leakage current as the drain to source voltage is increased in GAA devices. In addition, poor epitaxial S/D growth has been observed in GAA devices, and this may cause epitaxial S/D feature defect and/or mobility reduction, and therefore degrade the GAA device's performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-13A and 3B-13B illustrate cross-sectional views of the semiconductor device at intermediate stages of the method of FIG. 1 in accordance with some embodiments of the present disclosure;

FIGS. 15A-17A and 15B-17B illustrate cross-sectional views of the semiconductor device at intermediate stages of the method of FIG. 14 in accordance with some other embodiments of the present disclosure.

DETAILED DESCRIPTION

Figure 1:
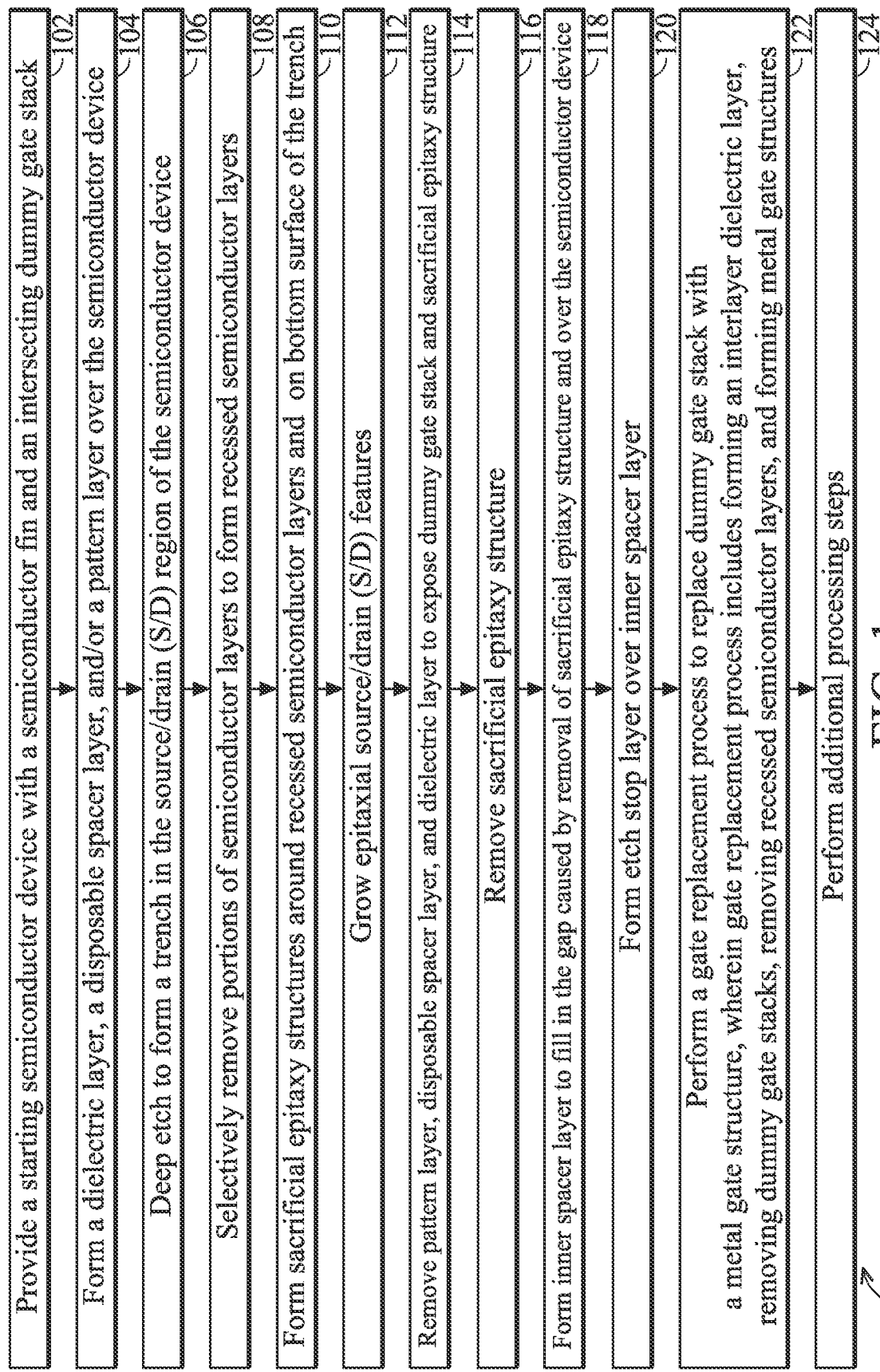
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may include multiple layers of semiconductor material of physically separated from one another. In some examples, a gate of the device is disposed above, alongside, and even between the semiconductor layers of the device. This configuration may place more semiconductor material proximate to the gate and thereby improve the control of carriers through the channel region. In turn, GAA devices allow more aggressive gate length scaling for both performance and density improvement than Fin-like Field-Effect-Transistor (FinFET) device. The present disclosure is generally related to formation of GAA device, wherein the epitaxial S/D feature of the GAA device is formed on a dielectric layer and is not directly contact with the substrate. A sacrificial epitaxy structure is used during the fabrication and is later replaced by an inner spacer. The GAA device examples in the present disclosure may exhibit DIBL improvement and better leakage control. Of course, these advantages are merely exemplary, and no particular advantage is required for any particular embodiment.

Figure 2A:
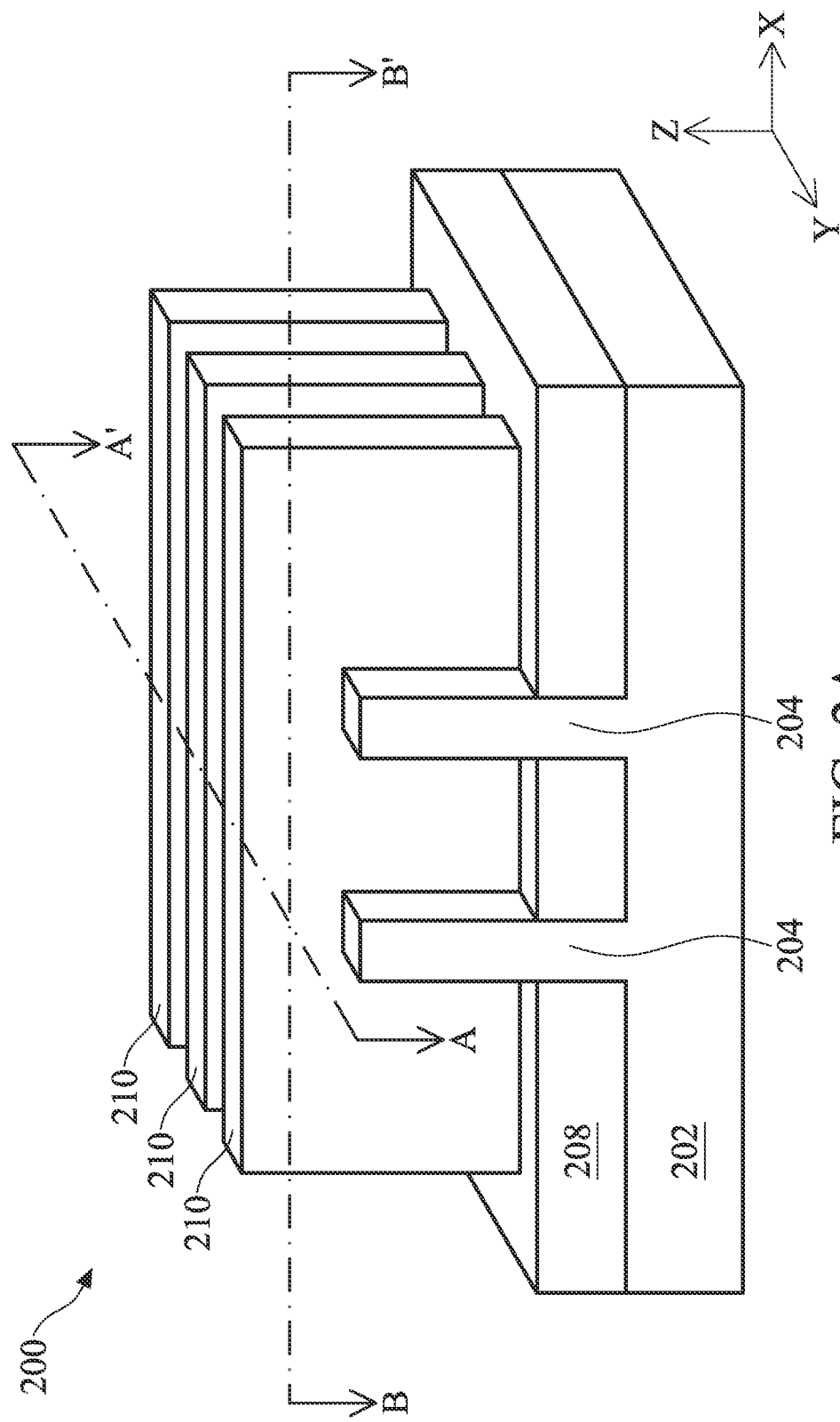
FIG. 2A illustrates a three-dimensional perspective view of an example semiconductor device in accordance with some embodiments of the present disclosure.
Figure 2B:
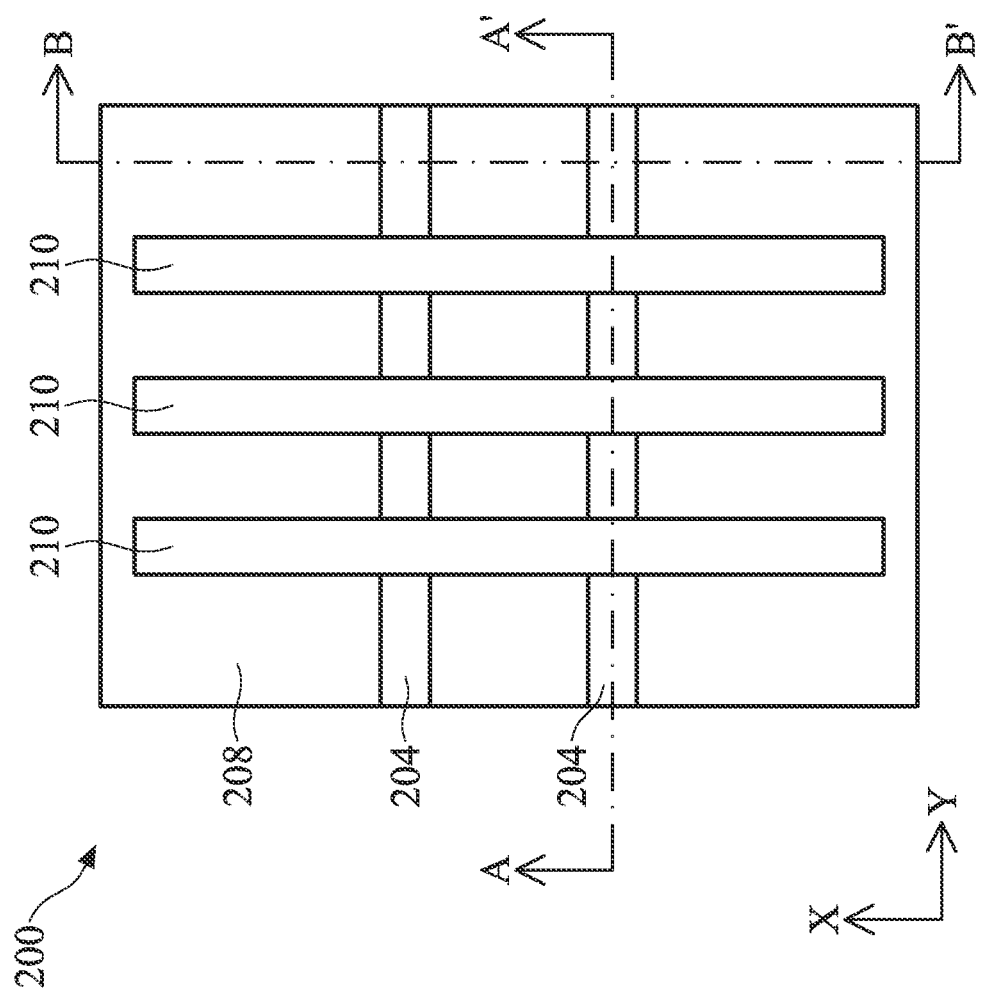
FIG. 2B illustrates a planar top view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2A illustrates a three-dimensional view of device 200; FIG. 2B illustrates a planar top view of device 200; FIGS. 3A-13A illustrate cross-sectional views of device 200 taken along the length of a fin as indicated by plane AA' shown in FIGS. 2A and 2B (that is, along a y-direction); and FIGS. 3B-13B illustrate cross-sectional views of device 200 taken across a set of source/drain regions as indicated by plane BB' shown in FIGS. 2A and 2B (that is, along an x-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET or a GAA FET), the present disclosure may also provide embodiments for fabricating planar FET devices.

Referring to FIGS. 1 and 2A-2B, at operation 102, method 100 provides a semiconductor device 200 that includes one or more semiconductor fins 204 protruding from a substrate 202 and separated by an isolation structure 208 and one or more dummy gate stacks 210 disposed over substrate 202 and semiconductor fins 204. Dummy gate stacks 210 defines a channel region, a source region and a drain region of fins 204. Device 200 may include other components, such as gate spacers disposed on sidewalls of dummy gate stack 210, various hard mask layers disposed over the dummy gate stack 210, barrier layers, other suitable layers, or combinations thereof.

In the depicted embodiment of FIGS. 2A and 2B, device 200 comprises a substrate (wafer) 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}$P), arsenic, other n-type dopant, or combinations thereof. In the depicted implementation, substrate 202 includes p-type doped region (for example, p-type wells) doped with p-type dopants, such as boron (for example, $^{11}$B, BF2), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Device 200 includes semiconductor fins 204, and the lower portions of semiconductor fins 204 (FIG. 2A) are separated by an isolation structure 208. Isolation structure 208 electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. Isolation structure 208 includes an isolation material, such as silicon oxide, silicon nitride, silicon oxynitride, other suitable isolation material (for example, including silicon, oxygen, nitrogen, carbon, and/or other suitable isolation constituent), or combinations thereof.

Each semiconductor fin 204 may be suitable for providing an n-type FET or a p-type FET. In some embodiments, semiconductor fins 204 as illustrated herein may be suitable for providing FETs of a similar type, i.e., both n-type or both p-type. Alternatively, they may be suitable for providing FETs of opposite types, i.e., an n-type and a p-type. Semiconductor fins 204 are oriented substantially parallel to one another. Semiconductor fins 204 each have a width defined in an x-direction, a length defined in a y-direction, and a height defined in a z-direction. Furthermore, each of semiconductor fins 204 has at least one channel region and at least one source region and drain region defined along their length in the y-direction, where the at least one channel region is covered by dummy gate stacks 210 and is disposed between the source regions and the drain region.

In some embodiments, semiconductor fins 204 includes a semiconductor layer stack having various semiconductor layers (such as a heterostructure) disposed over substrate 202. In the depicted embodiments of FIGS. 3A/3B to 13A/13B, the semiconductor layer stack includes alternating semiconductor layers, such as semiconductor layers 204A composed of a first semiconductor material and semiconductor layers 204B composed of a second semiconductor material which is different from the first semiconductor material. The different semiconductor materials composed in alternating semiconductor layers 204A and 204B are provided for different oxidation rates and/or different etch selectivity. In some examples, semiconductor layers 204A comprise silicon (Si), and semiconductor layers 204B comprise silicon germanium (SiGe). Thus the semiconductor layer stack is arranged with alternating Si/SiGe/Si/SiGe/ . . . layers from bottom to top. As shown in the depicted embodiments of FIGS. 3A/3B to 13A/13B, the bottom semiconductor layer 204A may be merged with substrate 202 (which comprises Si as well) and forms a portion of substrate 202. In some embodiments, the material of the top semiconductor layer in the semiconductor layer stack is the same as the bottom semiconductor layer. In some other embodiments, the material of the top semiconductor layer is different from the bottom semiconductor layer in the semiconductor layer stack. In some examples, for a semiconductor layer stack that includes alternating Si and SiGe layers, the bottom semiconductor layer comprises Si, and the top semiconductor layer may be a Si or SiGe layer.

In some embodiments, the semiconductor layer stack includes semiconductor layers of the same material but with alternating constituent atomic percentages, such as semiconductor layers having a constituent of a first atomic percent and semiconductor layers having the constituent of a second atomic percent. In some examples, the semiconductor layer stack includes silicon germanium layers having alternating silicon and/or germanium atomic percentages (for example, $Si_aGe_b/Si_cGe_d/Si_aGe_b/Si_cGe_d$ from bottom to top, where a and c are different atomic percentages of silicon and b and d are different atomic percentages of germanium). In various embodiments, the alternating material layers in the semiconductor layer stack may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the alternating semiconductor layers may be chosen based on providing differing oxidation rates and/or etch selectivity.

In some other embodiments, semiconductor layers 204A may be undoped or substantially dopant-free (i.e., having an extrinsic dopant concentration from about 0 cm$^{-3}$ to about 1×10$^{17}$ cm$^3$). In some examples, no intentional doping is performed when forming semiconductor layers 204A. In some other embodiments, semiconductor layers 204A may be doped with a p-type dopant such as boron or boron compound (B, $^{11}$B or BF2), aluminum (Al), indium (In), gallium (Ga), or combinations thereof for a p-type channel, or an n-type dopant such as phosphorus (P, 31P), arsenic (As), antimony (Sb), or combinations thereof for an n-type channel. In some implementations, semiconductor layers 204B may include SiGe with about 20-40% germanium (Ge) in molar ratio. For example, semiconductor layers 204B may comprise SiGe with about 25% of Ge in molar ratio. In some embodiments, semiconductor layers 204A may include different compositions among them, and semiconductor layers 204B may include different compositions among them. A number of the total semiconductor layers in semiconductor fins 204 depends on design of device 200. For example, semiconductor fins 204 may comprise three to ten alternating semiconductor layers. In some embodiments, different semiconductor layers in the semiconductor layer stack have the same thickness in a z-direction. In some other embodiments, different semiconductor layers in the semiconductor layer stack have different thickness. In some such embodiments, the bottom layer of the semiconductor layer stack (which is partially buried in isolation structure 208) is thicker than other layers of the semiconductor layer stack. In some embodiments, each semiconductor layer that extends above isolation structure 208 has a thickness ranging from about 5 nanometers (nm) to about 20 nm and a height H1 of semiconductor fin 204 (semiconductor layer stack) in the z-direction about 50 nm to about 70 nm. However, the present disclosure is not limited to such configuration.

Semiconductor fins 204 including alternating semiconductor layers 204A and 204B are formed over substrate 202 using any suitable process. In some embodiments, a combination of deposition, epitaxy, photolithography, etching, and/or other suitable processes are performed to form semiconductor fins 204. Isolation structure 208 and semiconductor fins 204 may be formed in different orders. In some embodiments, isolation structure 208 is formed before semiconductor fins 204 (an isolation-first scheme). In some other embodiments, semiconductor fins 204 are formed before isolation structure 208 (a fin-first scheme). These two embodiments are further discussed below by way of examples.

In an isolation-first scheme, a masking element is formed over substrate 202 through a photolithography process. The photolithography process may include forming a photoresist (or resist) over substrate 202, exposing the resist to a pattern that defines various geometrical shapes, performing post-exposure bake processes, and developing the resist to form the masking element. Then, substrate 202 is etched through the masking element to form first trenches therein. The etching processes may include one or more dry etching processes, wet etching processes, and other suitable etching techniques. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO3), and/or acetic acid (CH3COOH); or other suitable wet etchant(s). Subsequently, the first trenches are filled with a dielectric material, such as silicon oxide and/or silicon nitride, and performs a chemical mechanical planarization (CMP) process to planarize top surfaces of the dielectric material and substrate 202. The dielectric material may be formed by chemical vapor deposition (CVD), plasma enhanced CVD (PECVD), physical vapor deposition (PVD), thermal oxidation, or other techniques. This layer of dielectric material is referred to as dielectric layer, which isolates various portions of substrate 202. Next, substrate 202 is etched while dielectric layer remains substantially unchanged through a selective etching process, thereby forming second trenches between various portions of dielectric layer. The second trenches are etched to a desired depth for growing semiconductor fins 204 therein. The etching process may be a dry etching process, a wet etching process, or another suitable etching technique. Subsequently, various semiconductor layers comprising different semiconductor materials are alternately deposited in the second trenches. For example, the semiconductor layers may be grown by a molecular beam epitaxy (MBE) process, a chemical vapor deposition (CVD) process such as a metal organic CVD (MOCVD) process, and/or other suitable epitaxial growth processes. In some embodiments, a first type of the deposited layers, such as semiconductor layers 204A, include the same material (for example, Si) as substrate 202. In some other embodiments, all deposited layers (including semiconductor layers 204A and semiconductor layers 204B) include different materials than substrate 202. A chemical mechanical planarization (CMP) process may be performed to planarize a top surface of device 200. Subsequently, dielectric layer is recessed to provide semiconductor fins 204 extending above a top surface of dielectric layer. In some embodiments, a recessing depth is controlled (e.g., by controlling an etching time) so as to obtain a desired height (for example, 50-70 nm) of the exposed upper portion of semiconductor fins 204. The remaining portions of dielectric layer become isolation structure 208.

A fin-first scheme may include substantially the same or similar processes as discussed above, albeit in different orders. In some examples, first, various semiconductor layers comprising different semiconductor materials are alternatively deposited over substrate 202. A masking element is formed over the semiconductor layers through a photolithography process. The semiconductor layers are then etched through the masking element to form trenches therein. The remaining portions of the semiconductor layers become semiconductor fins 204. Subsequently, a dielectric material, such as silicon oxide, is deposited into the trenches. A chemical mechanical planarization (CMP) process may be performed to planarize a top surface of device 200. Thereafter, the dielectric material is recessed to form isolation structure 208.

In the depicted embodiment of FIGS. 2A and 2B, various dummy gate stacks 210 are formed over semiconductor fins 204. Each dummy gate stack 210 serves as a placeholder for subsequently forming a metal gate structure. As will be discussed in detail below, portions of dummy gate stacks 210 are replaced with metal gate structures during a gate replacement process after other components (for example, epitaxial S/D features 250) of semiconductor device 200 are fabricated. Dummy gate stacks 210 extend along x-direction and traverse respective semiconductor fin 204. In the depicted embodiment, dummy gate stacks 210 are disposed over channel regions of semiconductor fins 204, thereby interposing respective S/D regions of semiconductor fins 204. Dummy gate stacks 210 engage the respective channel regions of semiconductor fins 204, such that current can flow between the respective S/D regions of semiconductor fins 204 during operation. In the depicted embodiment of FIGS. 3A and 3B, each dummy gate stack 210 includes a dummy gate electrode 211 comprising polysilicon (or poly) and various other layers, for example, a first hard mask layer 216 disposed over dummy gate electrode 211, and/or a second hard mask layer 218 disposed over first hard mask layer 216. Dummy gate stacks 210 may also include an interfacial layer 224 disposed over semiconductor fins 204 and substrate 202, and below dummy gate electrodes 211. First and second hard mask layers 216 and 218 may each include any suitable dielectric material, such as a semiconductor oxide and/or a semiconductor nitride. In some embodiments, hard mask layer 216 includes silicon carbonitride (SiCN) or silicon nitride (SiN), and hard mask layer 218 includes silicon oxide ($SiO_2$). Interfacial layer 224 may include any suitable material, for example, silicon oxide. Dummy gate electrode 211 can be single dielectric layer of multiple layers. A material of dummy gate electrode 211 can be selected from silicon oxide ($SiO_2$), silicon oxide carbide (SiOC), silicon oxide nitride (SiON), silicon carboxynitride (SiOCN), carbon content oxide, nitrogen content oxide, carbon and nitrogen content oxide, metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), any other suitable material, or combinations thereof.

Dummy gate stacks 210 are formed by deposition processes, lithography processes, etching processes, other suitable processes, or combinations thereof. For example, a deposition process may be performed to form a dummy gate electrode layer 211, a first hard mask layer 216, and a second hard mask layer 218 over substrate 202, semiconductor fins 204, and isolation structure 208. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern dummy gate electrode layer 211, first hard mask layer 216, and second hard mask layer 218 to form dummy gate stacks 210, such that dummy gate stacks 210 wrap semiconductor fins 204. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Still referring to FIGS. 1, 3A and 3B, at operation 104, method 100 forms a dielectric layer 220 over semiconductor device 200. In many embodiments, dielectric layer 220 is formed conformally over semiconductor device 200, including semiconductor fins 204 and dummy gate stacks 210. Dielectric layer 220 may include any suitable dielectric material, such as a nitrogen-containing dielectric material, and may be formed by any suitable method, such as ALD, CVD, PVD, other suitable methods, or combinations thereof. In the depicted embodiment, dielectric layer 220 is formed by a thermal ALD process. In some examples, the dielectric layer 220 may include silicon nitride (SiN), silicon carbonitride (SiCN), silicon oxycarbonitride (SiOCN), other suitable dielectric materials, or combinations thereof.

Still referring to FIGS. 1, 3A and 3B, also at operation 104, method 100 forms a disposable spacer layer 222 over dielectric layer 220. Similar to dielectric layer 220, disposable spacer layer 222 may be formed conformally over dummy gate stacks 210, that is, having about the same thickness on top surfaces and sidewalls of dielectric layer 220. Disposable spacer layer 222 may include any suitable dielectric material, for example, silicon, oxygen, carbon, nitrogen, other suitable material, or combinations thereof (for example, silicon oxide, silicon nitride, silicon oxynitride, or silicon carbide, low K (K<3.9) dielectric). In some examples, disposable spacer layer 222 include a multi-layer structure, such as a first dielectric layer that includes silicon nitride and a second dielectric layer that includes silicon oxide. In some embodiments, dielectric layer 220 and disposable spacer layer 222 include different compositions, such that an etching selectivity exists between dielectric layer 220 and disposable spacer layer 222 when both are subjected to a common etchant. Disposable spacer layer 222 may be formed by any suitable method, such as ALD, CVD, PVD, other suitable methods, or combinations thereof.

Still referring to FIGS. 1, 3A and 3B, also at operation 104, method 100 forms a pattern layer 228 over device 200. In some embodiments, pattern layer 228 is formed conformally over device 200, that is, having about the same thickness on top surfaces and sidewalls of disposable spacer layer 222. Pattern layer 228 may include any suitable material that has a different etch rate than disposable spacer layer 222 and/or dielectric layer 220, such as silicon nitride, silicon carboxynitride, other suitable dielectric materials, or combinations thereof. Pattern layer 228 is deposited by any suitable method, such as ALD, to any suitable thickness.

Figures 4A, 4B:
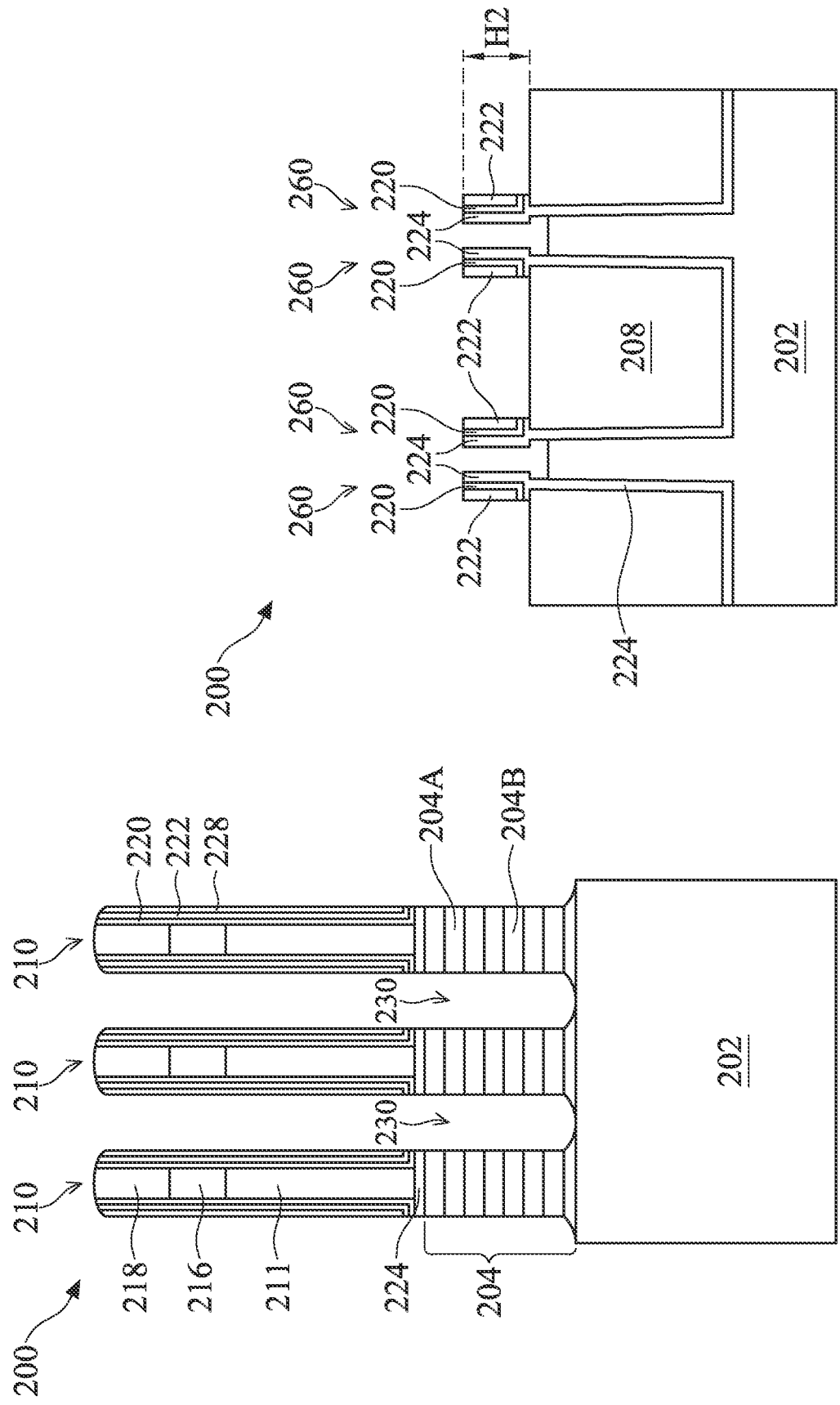

Referring to FIGS. 1, 4A and 4B, at operation 106, method 100 removes portions of semiconductor fins 204 in the S/D regions to form trenches 230 therein. Therefore, sidewalls of alternating semiconductor layers 204A and 204B are exposed in trenches 230. Trenches 230 are recessed so that a bottom surface of each trench 230 is below a bottom surface of the bottom semiconductor layer 204B. In the depicted embodiment of FIGS. 4A and 4B, the S/D regions of device 200 is etched so that portions of the bottom semiconductor layer 204A (portions of substrate 202) are etched. In some embodiments, the bottom surface of trench 230 is about 5 nm to about 20 nm below the bottom surface of the bottom semiconductor layer 204B. In some examples, the extent that the bottom surface of trench 230 below the bottom surface of the bottom semiconductor layer 204B is substantially equal to the thickness of each semiconductor layer 204A and 204B extends above isolation structure 208. In some embodiments, method 100 forms trenches 230 by a suitable etching process, such as a dry etching process, a wet etching process, a reactive ion etching (RIE) process, or combinations thereof. In some embodiments, method 100 selectively removes portions of semiconductor fins 204 to form trenches 230 along pattern layer 228 without etching or substantially etching portions of layers 220 and 222 formed on sidewalls of dummy gate stacks 210. In the depicted embodiment of FIGS. 4A and 4B, also at operation 106, top portions of dielectric layer 220, disposable spacer layer 222 and pattern layer 228, as well as second hard mask layer 218 formed over dummy gate electrode 211 may be removed. The etching process at operation 106 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. Referring to FIG. 4A, the remaining portions of dielectric layer 220, disposable spacer layer 222, and pattern layer 228 along dummy gate stacks 210 form gate spacers. Referring to FIG. 4B, the remaining portions of dielectric layer 220, disposable spacer layer 222, and interfacial layer 224 along the removed portions of semiconductor fins 204 are refer to fin sidewalls 260. In some embodiments, a height H2 of fin sidewalls 260 in the z-direction is less than about 30 nm.

Now referring to FIGS. 1, 5A and 5B, at operation 108, method 100 selectively removes portions of semiconductor layers 204B exposed in trenches 230, by a suitable etching process to form recessed semiconductor layers 204B between semiconductor layers 204A, such that portions (edges) of semiconductor layers 204A are suspended in trenches 230. An extent of which semiconductor layers 204B are removed may be controlled by duration of the etching process. In some embodiments, an extent W of the selective removing of semiconductor layers 204B is about 3-8 nm. As discussed above, in the depicted embodiment, semiconductor layers 204A include Si and semiconductor layers 204B include SiGe. Accordingly, the etching process at operation 108 selectively removes portions of SiGe layers 204B without removing or substantially removing Si layers 204A. In some embodiments, the etching process is a selective isotropic etching process (e.g., a selective dry etching process or a selective wet etching process), and the extent of which semiconductor material 204B is removed is controlled by duration of the etching process. In some embodiments, the selective wet etching process may include a hydro fluoride (HF), fluoride (F2) or NH4OH etchant. In the depicted embodiment where semiconductor layers 204A comprise Si and semiconductor layers 204B comprise SiGe, the selective removal of the SiGe layers may include a SiGe oxidation process followed by a SiGeOx removal. For example, the SiGe oxidation process may include forming and patterning various masking layers such that the oxidation is controlled to the SiGe layers. In other embodiments, the SiGe oxidation process is a selective oxidation due to the different compositions of semiconductor layers 204A and 204B. In some embodiments, the SiGe oxidation process may be performed by exposing device 200 to a wet oxidation process, a dry oxidation process, or a combination thereof. Thereafter, the oxidized semiconductor layers, which include SiGeOx, are removed by an etchant such as NH4OH or diluted HF.

Now referring to FIGS. 1, 6A and 6B, at operation 110, method 100 forms sacrificial epitaxy structures 240 around recessed semiconductor layers 204B and on the bottom surface of trenches 230. Sacrificial epitaxy structures 240, semiconductor layers 204A, and semiconductor layers 204B have different compositions. In various embodiments, sacrificial epitaxy structures 240 are provided to have different oxidation rates and/or different etch selectivity than semiconductor layers 204A and semiconductor layers 204B. In the depicted embodiment, semiconductor layers 204A comprises Si, semiconductor layers 204B comprises SiGe, and the molar ratio of Ge in semiconductor layers 204B is about 20-40%. In some embodiments, sacrificial epitaxy structures 240 comprise SiGe, and the molar ratio of Ge in the sacrificial epitaxy structures 240 is more than 45%. Thus, sacrificial epitaxy structures 240 has a different oxidation rate and/or different etch selectivity from semiconductor layers 204A and semiconductor layers 204B. In some other embodiments, sacrificial epitaxy structures 240 comprise germanium (Ge), other suitable material, or combination thereof to provide different oxidation rates and/or different etch selectivity than semiconductor layers 204A and 204B. In a furtherance of the embodiment, sacrificial epitaxy structures 240 may be doped with carbon (C), boron (B), other dopant, or combinations thereof to achieve better different oxidation rates and/or different etch selectivity than semiconductor layers 204A and 204B.

Sacrificial epitaxy structures 240 may be formed by various processes. For example, a sacrificial epi layer 240 may be conformally epitaxially grown in recess 230, that is, sacrificial epi layer 240 is grown with a relatively uniform layer thickness all around in recess 230 covering sidewall surfaces of semiconductor layers 204A and recessed semiconductor layers 204B and the bottom surface of trenches 230. Subsequently, sacrificial epi layer 240 is selectively etched to expose the sidewall surfaces of semiconductor layers 204A in trenches 230. The remaining portions of sacrificial epi layer 240 form sacrificial epitaxy structures 240. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors. In some embodiments, sacrificial epitaxy structures 240 are doped by an ion implantation process subsequent to a deposition process. In some embodiments, annealing processes are performed to activate dopants in sacrificial epitaxy structures 240.

As discussed above, semiconductor layers 204A, 204B, and sacrificial epitaxy structures 240 comprises different materials of different oxidation rates and/or different etch selectivity. Accordingly, the etching process at operation 110 selectively removes portions of sacrificial epi layer 240 without removing or substantially removing semiconductor layers 204A and 204B to form sacrificial epitaxy structures 240. In some embodiments, the etching process is a selective etching process (e.g., a selective dry etching process or a selective wet etching process), and the extent of which sacrificial epi layer 240 is removed is controlled by duration of the etching process until the sidewall surfaces of semiconductor layers 204A are exposed in trenches 230. A width of sacrificial epitaxy structures 240 around the recessed semiconductor layer 204B is substantially equal to the extent W (for example 3-8 nm) of which semiconductor layer 204B is recessed, so that sacrificial epitaxy structures 240 and semiconductor layer 204A form a continuous crystal sidewall surfaces of trenches 230 (S/D regions of device 200). In some embodiments, the selective wet etching process may include a hydro fluoride (HF), fluoride (F2) or NH4OH etchant. The selective removal of sacrificial epi layer 240 may also include an oxidation process followed by an oxidation removal. For example, the oxidation process may be a selective oxidation due to the different compositions of semiconductor layers 204A, 204B, and sacrificial epi layer 240. In some embodiments, the oxidation process may be performed by exposing device 200 to a wet oxidation process, a dry oxidation process, or a combination thereof. Thereafter, the oxidized sacrificial epitaxy layer 240 is removed by an etchant such as NH4OH or diluted HF. In some embodiments, a height H3 of sacrificial epi structures 240 at the bottom of recess 230 is about 10-30 nm.

In the present disclosure, sidewall and bottom surfaces of the S/D regions of GAA device may comprise only crystal materials which form a continuous surface. For example, in some embodiments, sidewall and bottom surfaces of S/D regions (trench 230) of device 200 are continuous surfaces and include only Si (semiconductor layer 204A) and SiGe (sacrificial epitaxy structures 240). The continuous crystalline surface provides an optimized environment for epitaxially growing S/D features. Thus, the defects caused by the combined S/D region surface including crystal and dielectric materials can be reduced and the GAA device performance is increased. Furthermore, because the S/D regions (trench 230) is etched, and the later formed epitaxial S/D features do not directly contact substrate 202, DIBL can be improved and current leakage is controlled. Details of this part will be discussed in the following description.

Now referring to FIGS. 1, 7A and 7B, at operation 112, method 100 grows epitaxial S/D features 250 in trenches 230 (the S/D regions) of device 200. In some embodiments, epitaxial S/D features 250 include the same material as semiconductor layers 204A (for example, both include silicon). In some other embodiments, epitaxial S/D features 250 and semiconductor layers 204A include different materials or compositions. In various embodiments, epitaxial S/D features 250 may include a semiconductor material such as silicon or germanium; a compound semiconductor such as silicon germanium, silicon carbide, gallium arsenide, gallium phosphide, indium phosphide, indium arsenide, indium antimonide; an alloy semiconductor such GaAsP, AlInAs, AlGaAs, InGaAs, GaInP, and/or GaInAsP; or combinations thereof.

An epitaxy process may be implement to epitaxially grow S/D features 250. The epitaxy process may include CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors. Epitaxial S/D features 250 may be doped with n-type dopants and/or p-type dopants. In some embodiments, epitaxial S/D features 250 are doped with boron, boron difluoride, carbon, other p-type dopant, or combinations thereof (for example, forming an Si:Ge:B epitaxial S/D feature or an Si:Ge:C epitaxial S/D feature). In some embodiments, epitaxial S/D features 250 are doped with phosphorous, arsenic, other n-type dopant, or combinations thereof (for example, forming an Si:P epitaxial S/D feature, an Si:C epitaxial S/D feature, or an Si:C:P epitaxial S/D feature). In some embodiments, epitaxial S/D features 250 may include multiple epitaxial semiconductor layers, and different epitaxial semiconductor layers are different in amount of dopant included therein. In some embodiments, epitaxial S/D features 250 include materials and/or dopants that achieve desired tensile stress and/or compressive stress in the channel regions. In some embodiments, epitaxial S/D features 250 are doped during deposition by adding impurities to a source material of the epitaxy process. In some embodiments, epitaxial S/D features 250 are doped by an ion implantation process subsequent to a deposition process. In some embodiments, annealing processes are performed to activate dopants in epitaxial S/D features 250 of semiconductor device 200, such as HDD regions and/or LDD regions. Referring to FIGS. 7A and 7B, because trench 230 (S/D regions of semiconductor device 200) is recessed and bottom surface of trench 230 is covered with sacrificial epitaxy structures 240, epitaxial S/D features 250 do not directly contact substrate 202.

Figure 8B:
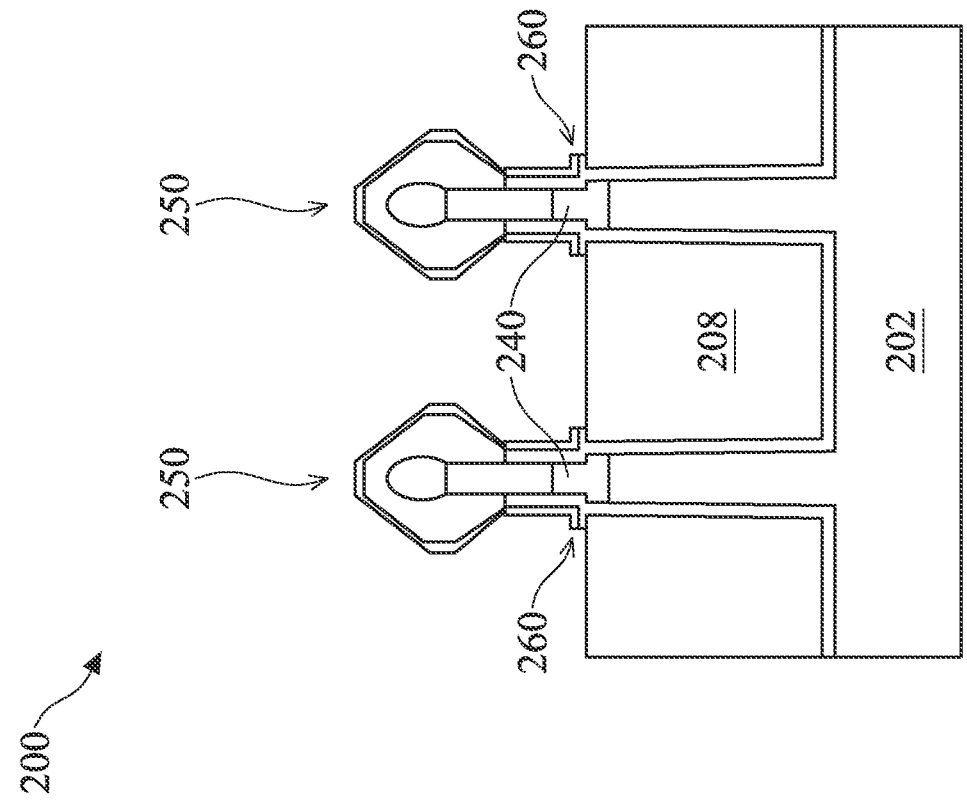
Figure 8A:
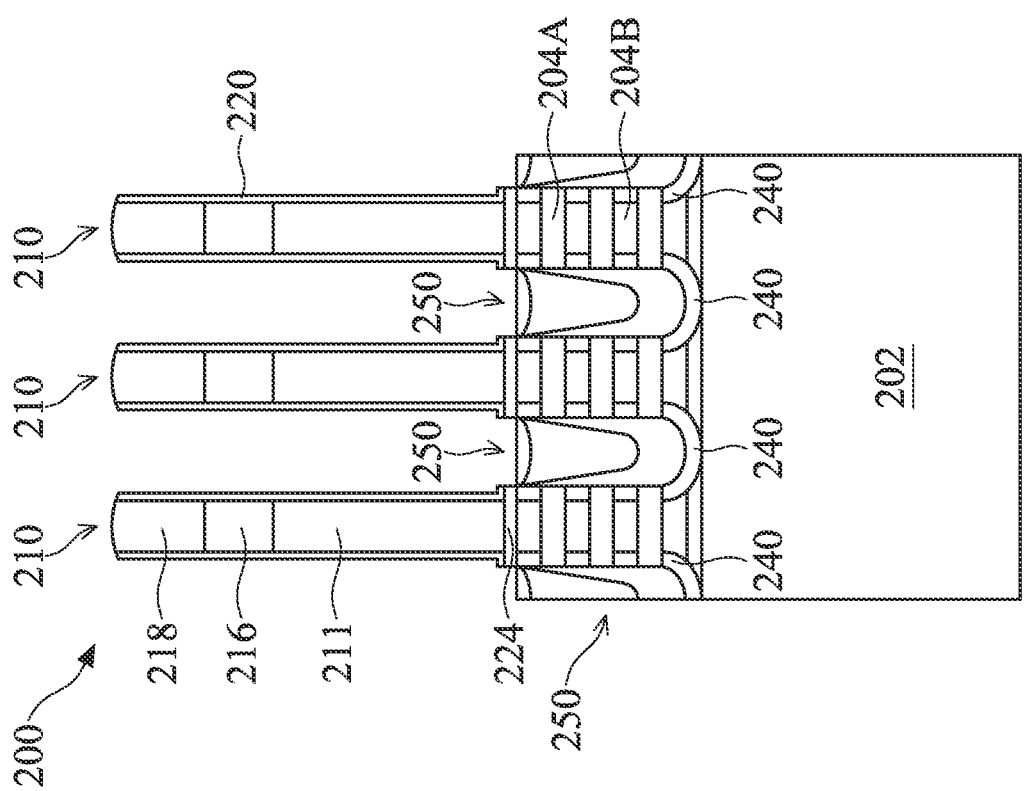

Referring to FIGS. 1, 8A and 8B, at operation 114, method 100 removes pattern layer 228 and disposable spacer layer 222. In some embodiments, disposable spacer layer 222 and pattern layer 228 each comprises a material having different etching rate than dielectric layer 220, epitaxial S/D features 250, and isolation structures 208, method 100 selectively etches disposable spacer layer 222 and pattern layer 228 without substantially removed dielectric layer 220, epitaxial S/D features 250, and isolation structures 208. The etching process can be a dry etching process, a wet etching process, or combinations thereof. Various etching parameters can be tuned to selectively etch pattern layer 228 and disposable spacer layer 222, such as etchant composition, etching temperature, etching solution concentration, etching time, etching pressure, source power, radio frequency (RF) bias voltage, RF bias power, etchant flow rate, other suitable etching parameters, or combinations thereof.

Figure 9A:
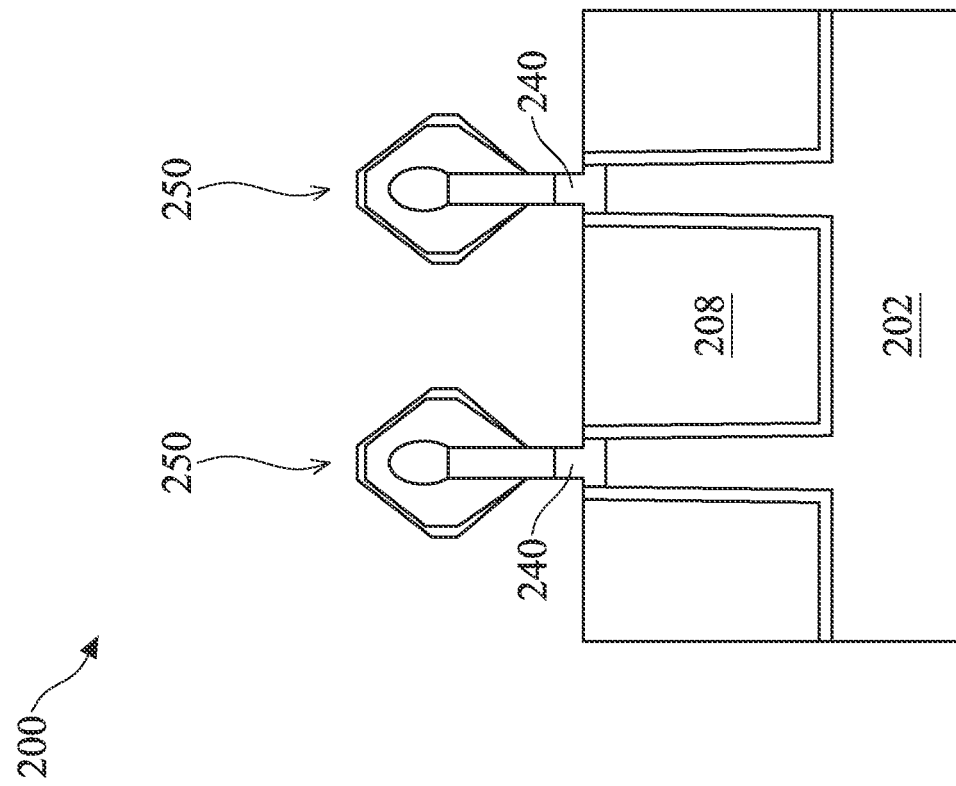
Figure 9B:
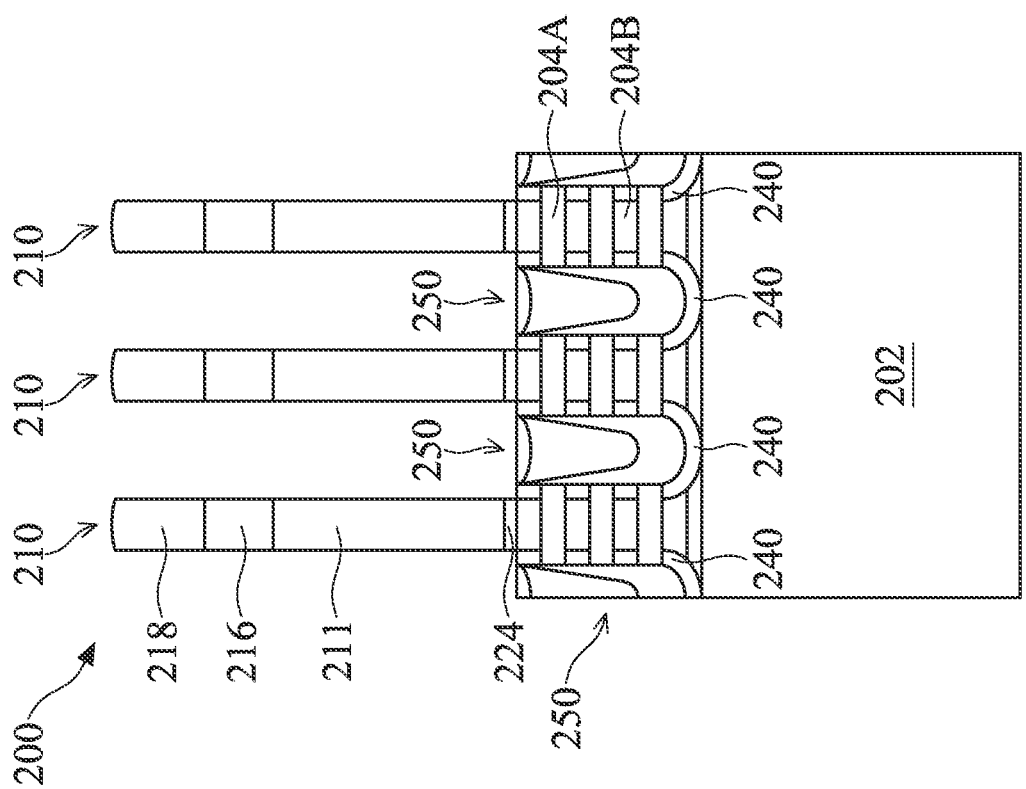

Referring to FIGS. 1, 9A and 9B, still at operation 114, dielectric layer 220 is etched back to exposed sidewall surfaces of dummy gate stacks 210. Portions of interfacial layer 224 under dielectric layer 220 is also removed. As depicted in FIG. 9B, fin sidewalls 260 comprising dielectric layer 220, disposable spacer layer 222, and interfacial layer 224 are removed at operation 114. The etching process can be a dry etching process, a wet etching process, or combinations thereof. After removing portions of interfacial layer 224, sacrificial epitaxial structures 240 are also exposed and ready to be removed in the next step.

Figure 10B:
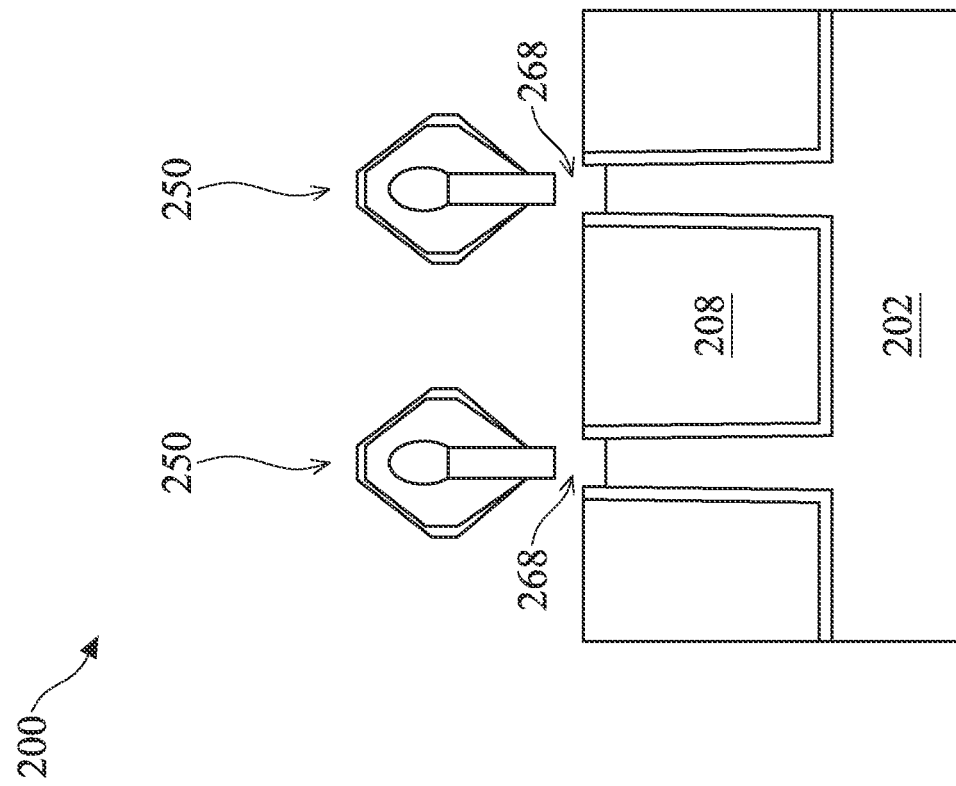
Figure 10A:
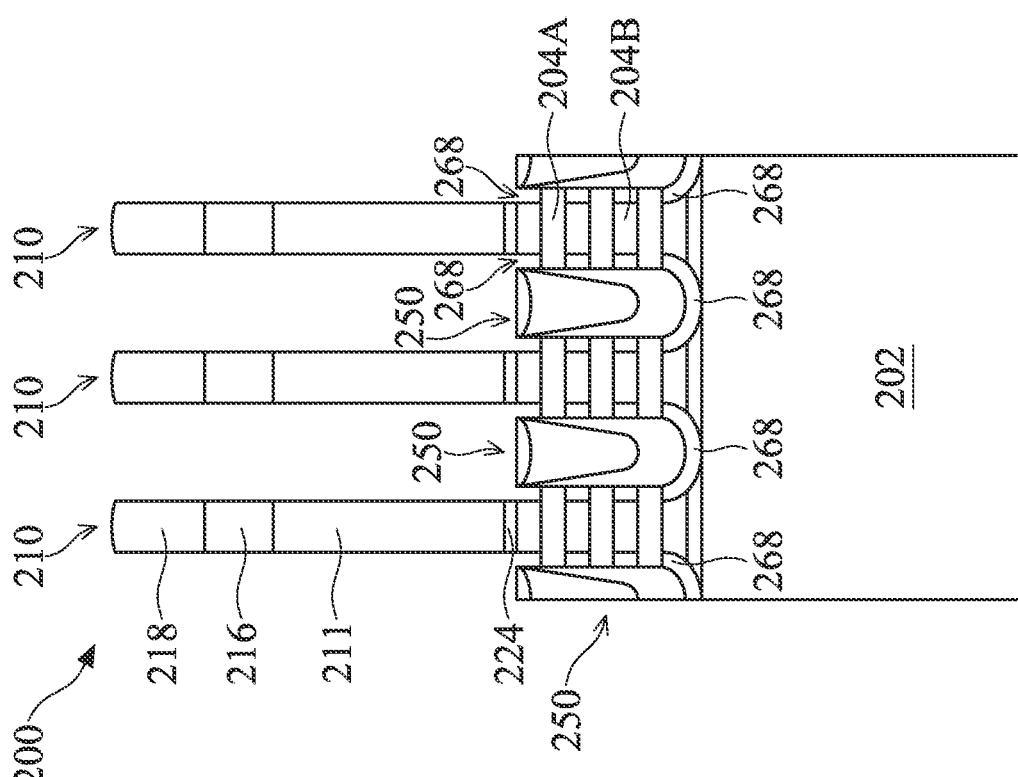

Now referring to FIGS. 1, 10A and 10B, at operation 116, method 100 selectively removes sacrificial epitaxy structures 240. As mentioned before, sacrificial epitaxy structures 240 comprise a material having different etch rate and/or oxidation rate than semiconductor layers 204A and 204B, and the surface of epitaxial S/D features 250 (for example, with a molar ratio of Ge about 20-30%). For example, in some embodiments, semiconductor layer comprises Si, semiconductor layer 204B comprises SiGe (molar ratio of Ge is about 20-30%), and sacrificial epitaxy structures 240 comprises SiGe (molar ratio of Ge is more than 45%). Or, in another implementation, sacrificial epitaxy structures 240 comprise germanium (Ge), other material, or combination thereof to ensure sacrificial epitaxy structures 240 has a different oxidation rate and/or different etch selectivity than semiconductor layers 204A and semiconductor layers 204B. Thus, at operation 116, method 100 removes sacrificial epitaxy structures 240 while semiconductor layers 204A and 204B remains substantially unchanged through a selective etching process. Gaps 268 are formed between sidewall surfaces of epitaxial S/D features 250 and recessed semiconductor layers 204B and between bottom surfaces of epitaxial S/D features 250 and bottom surfaces of trench 230 (top surface of substrate 202). The etching process may be a dry etching process, a wet etching process, or another suitable etching technique. In some embodiments, the selective etching process is a wet etching process including a hydro fluoride (HF) or NH4OH etchant. In some embodiments, the selective removal of sacrificial epitaxy structures 240 may include an oxidation process followed by an oxidation removal.

Figures 11A, 11B:
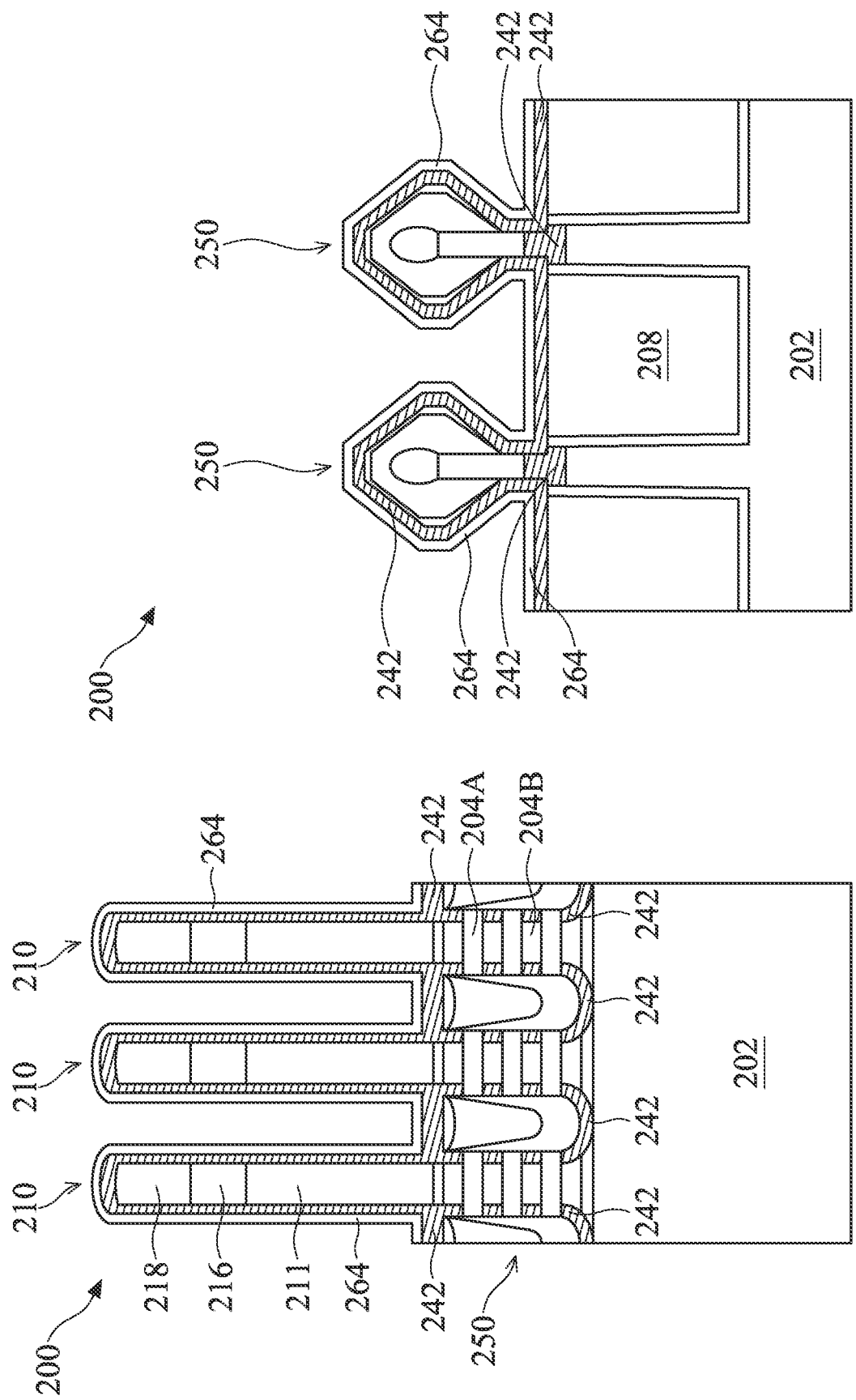

Referring to FIGS. 1, 11A and 11B, at operation 118, method 100 forms inner spacers 242 to fill in the gaps 268 between sidewall surfaces of epitaxial S/D features 250 and recessed semiconductor layers 204B and the gaps 268 between bottom surfaces of epitaxial S/D features 250 and top surface of substrate 202. Inner spacer 242 also covers dummy gate stacks 210, epitaxial S/D features 250 and isolation structures 208. In some embodiments, inner spacer 242 comprises low K dielectric material, silicon nitride, other dielectric material, or combinations thereof. Inner spacer 242 may be formed by any suitable method, such as ALD, CVD, PVD, other suitable methods, or combinations thereof. Inner spacer 242 conformally covers dummy gate stacks 210. In some embodiments, a thickness of inner spacers 242 over the top surface and sidewall surfaces of dummy gate stacks 210 are substantially the same. As depicted in FIGS. 11A and 11B, since inner spacers 242 fills the gap 268 between bottom surfaces of epitaxial S/D features 250 and top surface of substrate 202, epitaxial S/D features 250 is separated with substrate 202 by the dielectric inner spacer layer 242. This structure effectively solves the DIBL issue caused by the direct contact of epitaxial S/D features and substrate and further provides better leakage control of device 200.

Still referring to FIGS. 1, 11A and 11B, at operation 120, method 100 forms an etch stop layer (ESL) 264 over inner spacer layer 242. ESL 264 may include any suitable dielectric material, such as a low K dielectric material, and may be formed by any suitable method, such as ALD, CVD, PVD, other suitable methods, or combinations thereof. As illustrated in FIGS. 11A and 11B, ESL 264 disposed along inner spacers 242 and covers dummy gate stacks 210, epitaxial S/D features 250, and isolation features 208. In some embodiments, ESL 264 has a conformal profile over dummy gate stacks 210 (e.g., having about the same thickness on top and sidewall surfaces of dummy gate stacks 210). In some embodiments, ESL 264 also has a conformal profile over epitaxial S/D features 250 (e.g., having about the same thickness on top and sidewall surfaces of epitaxial S/D features 250). In some embodiments, ESL 264 has a thickness about 2 nm to about 7 nm.

Referring to FIGS. 1, 12A, 12B, 13A, and 13B, at operation 122, method 100 performs a gate replacement process to replace dummy gate stacks 210 with respective metal gate structures 270. At operation 122, method 100 first deposits an interlayer dielectric (ILD) layer 266 over device 200. ILD layer 266 is deposited over ESL 264 by any suitable process. ILD layer 266 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. ILD layer 266 may include a multi-layer structure having multiple dielectric materials and may be formed by a deposition process such as CVD, flowable CVD (FCVD), spin-on-glass (SOG), other suitable methods, or combinations thereof. In some embodiments, operation 122 further includes performing a CMP process to planarize a top surface of device 200. The CMP process also removes first hard mask layer 216 and second hard mask layer 218. As a result, dummy gate electrode 211 (poly layer) is exposed from a top surface of device 200 (not shown).

Referring to FIGS. 1, 12A, and 12B, still at operation 122, method 100 removes dummy gate electrodes 211 to expose the channel regions of semiconductor fins 204. In some embodiments, removing dummy gate electrode 211 includes one or more etching processes, such as wet etching, dry etching, RIE, or other etching techniques. Subsequently, method 100 removes recessed semiconductor layers 204B, or portions thereof, since the channel regions are exposed after removing of dummy gate electrodes 211. As a result, semiconductor layers 204A in the channel region are suspended in the channel region of semiconductor fins 204. Semiconductor layers 204A are slightly etched or not etched depending on the design of device 200. For example, semiconductor layers 204A may be slightly etched to form as a wire-like shape (for nanowire GAA transistors); semiconductor layers 204A may be slightly etched to form as a sheet-like shape (for nanosheet GAA transistors); or, semiconductor layers 204A may be slightly etched to form other geometrical shape (for other nanostructure GAA transistors). Semiconductor layers 204B are removed by a selective etching process that is tuned to remove only semiconductor layers 204B while semiconductor layers 204A and inner spacers 242 remain substantially unchanged. The selective etching may be a selective wet etching, a selective dry etching, or a combination thereof. In some embodiments, the selective wet etching process may include a hydro fluoride (HF) or NH4OH etchant. In some embodiments, the selective removal of semiconductor layers 204B may include an oxidation process (for example, to form semiconductor layers 204B comprising SiGeOx) followed by an oxidation removal (for example, SiGeOx removal).

Referring to FIGS. 1, 13A and 13B, still at operation 122, method 100 forms metal gate structures 270 over the channels region of semiconductor fins 204. Metal gate structures 270 wraps around each of semiconductor layers 204A suspended in the channel regions. Each of metal gate structures 270 may include multiple layers, such as a gate dielectric layer 274 wrapping semiconductor layers 204A, a gate electrode 276 comprising a work function metal layer formed over the gate dielectric layer 274, a bulk conductive layer formed over the work function metal layer, other suitable layers, or combinations thereof. The gate dielectric layer 274 may be a high-k layer and may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. Metal gate structures 270 may include other material layers, such as a barrier layer, a glue layer, a hard mask layer 272, and/or a capping layer. The various layers of metal gate structures 270 may be formed by any suitable method, such as CVD, ALD, PVD, plating, chemical oxidation, thermal oxidation, other suitable methods, or combinations thereof. Thereafter, method 100 may perform one or more polishing process (for example, CMP) to remove any excess conductive materials and planarize the top surface of device 200.

Referring to FIG. 1, at operation 124, method 100 performs further processing to complete the fabrication of device 200. For example, it may form contact openings, contact metal, as well as various contacts, vias, wires, and multilayer interconnect features (e.g., metal layers and interlayer dielectrics) over substrate 202, configured to connect the various features to form a functional circuit that may include one or more multi-gate devices.

Figure 14:
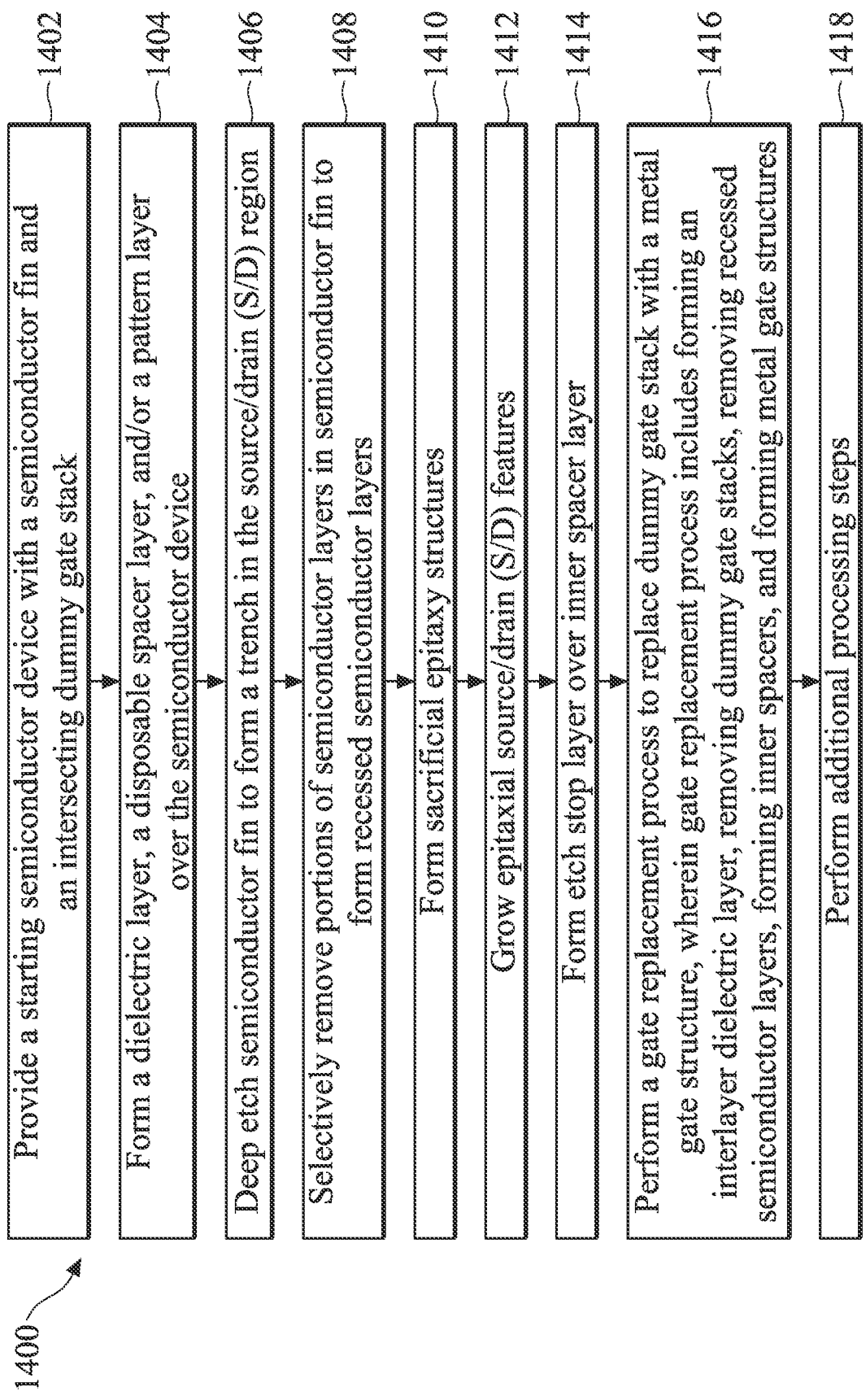
FIG. 14 illustrates a flowchart of an example method for making a semiconductor device in accordance with some other embodiments of the present disclosure.

FIG. 14 provides a further embodiment of a method 1400 for manufacturing a semiconductor device 1500 (hereafter called "device 1500" in short). Device 1500 are also illustrated with reference made to FIGS. 15A/15B to 17A/17B. FIG. 14 is a flowchart of method 1400 for manufacturing a semiconductor device according to aspects of the present disclosure. It is understood that additional steps can be provided before, during, and after method 1400, and some of the steps described can be replaced or eliminated for other embodiments of the method. The embodiment of method 1400 may include similar process steps as embodiments of method 100, which is disclosed above. With respect to method 1400, some details regarding processing and/or structure may be skipped for simplicity if they are similar to those described in the embodiment of method 100. FIGS. 15A/15B to 17A/17B are sectional views of semiconductor device 1500 according to various embodiments of the present disclosure. Semiconductor device 1500 of FIGS. 15A/15B to 17A/17B are similar in certain respects to semiconductor device 200 of FIGS. 2A/2B to 13A/13B. Accordingly, similar features in FIGS. 2A/2B to 13A/13B and FIGS. 15A/15B to 17A/17B are identified by the same reference numerals for clarity and simplicity. In this way, FIGS. 15A/15B to 17A/17B have been simplified for the sake of clarity to better convey the inventive concepts of the present disclosure.

Referring to FIG. 14, at operation 1402, method 1400 begins with providing a semiconductor device 1500 (similar as semiconductor device 200 in FIGS. 2A and 2B) that includes one or more semiconductor fins 204 protruding from a substrate 202 and separated by an isolation structure 208 and one or more dummy gate stacks 210 disposed over substrate 202. Semiconductor fins 204 comprises at least a semiconductor layer 204A comprising a first semiconductor material (for example, silicon (Si) as in the depicted embodiment of device 1500) and at least a semiconductor layer 204B comprising a second semiconductor material (for example, silicon germanium (SiGe) as in the depicted embodiment of device 1500). Operation 1402 of method 1400 of FIG. 14 is substantially similar to operation 102 of method 100 of FIG. 1. At operation 1404, method 1400 deposits a dielectric layer, a disposable spacer layer, and/or a pattern layer conformally over dummy gate stacks 210. Operation 1404 of method 1400 of FIG. 14 is substantially similar to operation 104 of method 100 of FIG. 1. At operation 1406, method 1400 removes portions of semiconductor fins 204 in the S/D regions to form trenches 230 therein. The semiconductor fins 204 are etched such that a bottom surface of trenches 230 is below a bottom surface of the bottom semiconductor layer 204B. In some embodiments, the bottom surface of trench 230 is about 5 nm to about 20 nm below the bottom surface of the bottom semiconductor layer 204B. At operation 1406, method 1400 also removes top portions of dielectric layer 220, disposable spacer layer 222, and pattern layer 228, as well as top portions of second hard mask layer 218. The remaining portions of dielectric layer 220, disposable spacer layer 222, and pattern layer 228 along dummy gate stacks 210 form gate spacers. The remaining portions of dielectric layer 220, disposable spacer layer 222, and interfacial layer 224 along the removed portions of semiconductor fins 204 are refer to fin sidewalls 260. A height H2 of fin sidewalls 260 in the z-direction is less than about 30 nm. Operation 1406 of method 1400 of FIG. 14 is substantially similar to operation 106 of method 100 of FIG. 1.

Still referring to FIG. 14, at operation 1408, method 1400 selectively removes portions of semiconductor layers 204B exposed in trenches 230, by a suitable etching process to form recessed semiconductor layers 204B between semiconductor layers 204A, such that portions (edges) of semiconductor layers 204A are suspended in trenches 230. Selectively removing portions of semiconductor layers 204B at operation 1408 of method 1400 of FIG. 14 is substantially similar to that of operation 108 of method 100 of FIG. 1. At operation 1410, method 1400 forms sacrificial epitaxy structures 240 around recessed semiconductor material 204B by various processes, for example, a conformally epitaxial grow process followed by an etching process. Sacrificial epitaxy structures 240 comprises a material having different etch selectivity and/or different oxidation rates than semiconductor layers 204A and semiconductor layers 204B. For example, in some of the embodiments of device 1500, semiconductor layers 204A comprises Si; semiconductor layers 204B comprises SiGe, and the molar ratio of Ge in semiconductor layers 204B is about 20-30%; and sacrificial epitaxy structures 240 comprises SiGe, and the molar ratio of Ge in sacrificial epitaxy structures 240 is more than 45%. In another embodiment, sacrificial epitaxy structures 240 comprises Ge, other suitable material, or combination thereof to provide different oxidation rates and/or different etch selectivity than semiconductor layers 204A and 204B. In a further embodiment, sacrificial epitaxy structures 240 may be doped with carbon (C), boron (B), other dopant, or combinations thereof to achieve better different oxidation rates and/or different etch selectivity from semiconductor layers 204A and 204B. In some embodiments, a height of sacrificial epitaxy structures 240 over bottom surface of trench 230 is about 10-30 nm. Sacrificial epitaxy structures 240 and semiconductor layers 204A together form a continuous crystal sidewall surfaces for S/D regions of device 1500. Forming of sacrificial epitaxy structures 240 at operation 1410 of method 1400 of FIG. 14 is substantially similar to that of operation 110 of method 100 of FIG. 1.

Still referring to FIG. 14, at operation 1412, method 1400 grows epitaxial S/D features 250 in trench 230 in the S/D regions of device 1500. Sidewall surfaces of S/D regions of device 1500 are continuous crystal sidewall surfaces, thus a healthy environment is provided for epitaxial growth of S/D features 250. Furthermore, because trenches 230 (S/D regions of semiconductor device 200) is recessed so that bottom surface of trench 230 is below the bottom surface of the bottom semiconductor layers 204B and is covered by sacrificial epitaxy structures 240, epitaxial S/D features 250 do not directly contact substrate 202 (separated by sacrificial epitaxy structures 240). Epitaxial growth of S/D features 250 at operation 1412 of method 1400 of FIG. 14 is substantially similar to that of operation 112 of method 100 of FIG. 1.

Referring now to FIGS. 14, 15A and 15B, at operation 1414, method 1400 forms an etch stop layer (ESL) 264 over device 1500. ESL 264 may include any suitable dielectric material, such as a low K dielectric material, and may be formed by any suitable method, such as ALD, CVD, PVD, other suitable methods, or combinations thereof. As illustrated in FIGS. 15A and 15B, ESL 264 is disposed to cover dummy gate stacks 210 and epitaxial S/D features 250. In some embodiments, ESL 264 has a conformal profile over dummy gate stacks 210 and gate spacers. In some embodiments, ESL 264 also has a conformal profile over epitaxial S/D features 250 and encloses fin sidewalls 260. In some embodiments, ESL 264 has a thickness is about 2 nm to about 7 nm.

Still referring now to FIGS. 14, 15A and 15B, at operation 1416, method 1400 performs a gate replacement process to replace dummy gate stacks 210 with respective metal gate structures 270. At operation 1416, method 1400 first deposits an interlayer dielectric (ILD) layer 266 over device 1500. ILD layer 266 is deposited over ESL 264 by any suitable process. ILD layer 266 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. ILD layer 266 may include a multi-layer structure having multiple dielectric materials and may be formed by a deposition process such as CVD, flowable CVD (FCVD), spin-on-glass (SOG), other suitable methods, or combinations thereof. In some embodiments, operation 1416 further includes performing a CMP process to planarize a top surface of device 1500. The CMP process also removes first hard mask layer 216 and second hard mask layer 218. As a result, dummy gate electrode 211 (poly layer) is exposed from a top surface of device 1500 (not shown).

Still referring to FIGS. 14, 15A and 15B, still at operation 1416, method 1400 removes dummy gate electrodes 211 to expose the channel regions of semiconductor fins 204. In some embodiments, removing dummy gate electrode 211 includes one or more etching processes, such as wet etching, dry etching, RIE, or other etching techniques. Subsequently, method 1400 removes recessed semiconductor layers 204B, or portions thereof, in the channel regions that are exposed after removing of dummy gate electrodes 211. As a result, semiconductor layers 204A are suspended in the channel regions of semiconductor fins 204. Semiconductor layers 204A are slightly etched or not etched depending on the design of device 1500. Semiconductor layers 204B are removed by a selective etching process that is tuned to remove only semiconductor layers 204B while semiconductor layers 204A and sacrificial epitaxy structures 240 remain substantially unchanged. The selective etching may be a selective wet etching, a selective dry etching, or a combination thereof. In some embodiments, the selective wet etching process may include a hydro fluoride (HF) or NH4OH etchant. In some embodiments, the selective removal of semiconductor layers 204B may include an oxidation process followed by an oxidation removal.

Now referring to FIGS. 14, 16A and 16B, still at operation 1416, method 1400 forms inner spacers 242 by any suitable process. In some embodiments, inner spacers 242 are formed by performing an oxidation process to sacrificial epitaxy structures 240. In the depicted embodiment where semiconductor layers 204A comprise Si and sacrificial epitaxy structures 240 comprise SiGe, forming of inner spacers 242 may include a SiGe oxidation process. For example, the SiGe oxidation process may include forming and patterning various masking layers such that the oxidation is controlled only to the SiGe sacrificial epitaxy structures 240. In other embodiments, the SiGe oxidation process is a selective oxidation due to the different compositions of semiconductor layers 204A, sacrificial epitaxy structures 240, and epitaxial S/D features 240. In some embodiments, both epitaxial S/D features 250 and sacrificial epitaxy structures 240 comprise silicon germanium. Epitaxial S/D features 250 may comprise a very thin layer (for example, about 1 nm to about 2 nm) of SiGe with a very low molar ratio of Ge (for example, less than about 25%) grown next to the sacrificial epitaxy structures 240. Since this very thin layer of SiGe comprise very low molar ratio of Ge, it can serve as an oxidation stop layer. Thus, when the selective oxidation is performed to sacrificial epitaxy structures 240, epitaxial S/D features 250 are substantially not affected. In some embodiments, the SiGe oxidation process may be a wet oxidation process, for example the SiGe oxidation process may be performed by exposing device 1500 to water (H2O). In some other embodiments, the SiGe oxidation process may be a dry oxidation process, for example an annealing process may be performed at a temperature of about 400 degree Celsius to about 600 degree Celsius for about 30-120 minutes. Or, the SiGe oxidation process may be a combination of wet and dry oxidation processes. Thereby, inner spacers 242 including SiGeOx are formed after the oxidation process to replace sacrificial epitaxy structures 240. In some other embodiments, inner spacers 242 may be formed by other suitable processes. For example, sacrificial epitaxy structures 240 may be selectively removed first. An inner spacer layer may be deposited and then etched back to form inner spacers 242. In some embodiments, inner spacers 242 may comprise low K dielectric material, silicon nitride, other dielectric material, or combinations thereof. As depicted in FIG. 16B, epitaxial S/D features 250 are separated from substrate 202 by dielectric inner spacers 242. Thereby, DIBL issue of device 1500 is reduced and leakage is better controlled.

Now referring to FIGS. 14, 17A and 17B, still at operation 1416, method 1400 forms metal gate structures 270 over the channel regions of semiconductor fins 204. Metal gate structures 270 wraps around each of semiconductor layers 204A suspended in the channel regions. Materials and structures of metal gate structures 270 in FIG. 17A are similar as those in FIG. 13A, and thus are not repeated here. The various layers of metal gate structures 270 may be formed by any suitable method, such as CVD, ALD, PVD, plating, chemical oxidation, thermal oxidation, other suitable methods, or combinations thereof. Thereafter, method 1400 may perform one or more polishing process (for example, CMP) to remove any excess conductive materials and planarize the top surface of device 1500.

Referring to FIG. 14, at operation 1418, method 100 performs further processing to complete the fabrication of device 1500. For example, it may form contact openings, contact metal, as well as various contacts, vias, wires, and multilayer interconnect features (e.g., metal layers and interlayer dielectrics) over substrate 202, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure form semiconductor device using sacrificial epitaxy structures. Semiconductor layers (for example, including Si) of the fin and sacrificial epitaxy structures (for example, including SiGe) together form a continuous crystal sidewall surface of the S/D region of the semiconductor device, which provides a healthy environment for S/D feature to epitaxially grown in the S/D region. In addition, dielectric inner spacers are formed between epitaxial S/D features and substrate, therefore DIBL induced by the direct contact of epitaxial S/D features and substrate can be reduced and leakage issue can be controlled.

The present disclosure provides for many different embodiments. Semiconductor device having self-aligned inner spacers and methods of fabrication thereof are disclosed herein. An exemplary method includes forming a fin over a substrate, wherein the fin comprises a first semiconductor layer and a second semiconductor layer including different semiconductor materials, and the fin comprises a channel region and a source/drain region. The method also forms a dummy gate structure over the channel region of the fin and over the substrate. A portion of the fin in the source/drain region is etched to form a trench therein, wherein a bottom surface of the trench is below a bottom surface of the second semiconductor layer. The method selectively removes an edge portion of the second semiconductor layer in the channel region such that the second semiconductor layer is recessed and forms a sacrificial structure around the recessed second semiconductor layer and over the bottom surface of the trench. The method further includes epitaxially growing a source/drain feature in the source/drain region of the fin.

In some embodiments, the method further includes selectively removing the sacrificial structure to form a gap between the source/drain feature and the recessed second semiconductor layer and to form a gap between the source/drain feature and the substrate; and forming inner spacers to fill in the gap between the source/drain feature and the recessed second semiconductor layer and the gap between the source/drain feature and the substrate.

In some embodiments, the method further includes performing an oxidation process to the sacrificial structure to form inner spacers. The oxidation process may be a dry oxidation process and is performed at a temperature of about 400 degrees Celsius to about 600 degrees Celsius for about 30 minutes to about 120 minutes.

In some embodiments, a semiconductor material of the sacrificial structure has a different etch selectivity or a different oxidation rate than the first semiconductor layer and the second semiconductor layer.

In some embodiments, the sacrificial structure and the first semiconductor layer form a continuous surface of the source/drain region of the fin before epitaxially growing the source/drain feature.

In some embodiments, the method further includes removing the dummy gate structure to expose the channel region of the fin; selectively etching the second semiconductor layer in the channel region of the fin; and forming a metal gate structure over the channel region of the fin.

Another exemplary method includes forming a fin over a substrate, wherein the fin comprises a first semiconductor layer and a second semiconductor layer including different semiconductor materials. The method includes forming a dummy gate structure over the substrate and the fin to define a channel region and a source/drain region of the fin. The method etches a portion of the first semiconductor layer and the second semiconductor layer in the source/drain region of the fin to form a trench, and selectively removes a portion of the second semiconductor layer in the channel region of the fin such that the second semiconductor layer is recessed. The method further includes forming a sacrificial structure in the trench to cover the recessed second semiconductor layer and the bottom surface of the trench; and epitaxially growing a source/drain feature in the source/drain region of the fin. The method further includes forming an inner spacer to replace the sacrificial structure.

In some embodiments, forming the sacrificial structure comprises epitaxially growing a sacrificial layer in the trench; and etching the sacrificial layer to expose sidewalls of the first semiconductor layer.

In some embodiments, forming the inner spacer comprises removing the sacrificial structure to form a gap between the source/drain feature and the second semiconductor layer and to form a gap between the source/drain feature and the substrate; and forming the inner spacer to fill in the gap between the source/drain feature and the second semiconductor layer and the gap between the source/drain feature and the substrate.

In some embodiments, forming the inner spacer comprises performing an oxidation process to the sacrificial structure to form the inner spacer.

In some embodiments, a bottom surface of the trench is below a bottom surface of the second semiconductor layer about 5 nanometers to about 20 nanometers.

In some embodiments, a height of the sacrificial structure over the bottom surface of the trench is about 10 nanometers to about 30 nanometers.

In some embodiments, a semiconductor material of the sacrificial structure has a different etch selectivity or a different oxidation rate than the first semiconductor layer and the second semiconductor layer.

In some embodiments, the first semiconductor layer of the fin comprises silicon (Si); the second semiconductor layer of the fin comprises silicon germanium (SiGe), wherein a molar ratio of germanium (Ge) is about 20% to about 40%; and the sacrificial structure comprises SiGe, wherein a molar ratio of germanium (Ge) is more than about 45%.

In some embodiments, the sacrificial structure and the first semiconductor layer form a continuous surface of the source/drain region of the fin before epitaxially growing the source/drain feature.

An exemplary semiconductor device includes a fin disposed over a substrate, wherein the fin comprises a channel region and a source/drain region and a gate structure disposed over the substrate and wrapping around the channel region of the fin. The semiconductor device also comprises a source/drain feature epitaxially grown in the source/drain region of the fin, and a dielectric inner spacer disposed between the source/drain feature and the gate structure and between the source/drain feature and the substrate.

In some embodiments, a height of the inner spacer between the source/drain feature and the substrate is about 10 nanometers to about 30 nanometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin protruding from a substrate and disposed between portions of an isolation structure;
   a semiconductor layer over the fin;
   a gate dielectric wrapping around the semiconductor layer;
   a gate electrode wrapping around the gate dielectric disposed on the semiconductor layer;
   a source/drain feature interfacing with the semiconductor layer; and
   a dielectric inner spacer having first portions contacting side surfaces of the source/drain feature and second portions contacting top and bottom surfaces of the source/drain feature; and
   an etch stop layer over and in direct contact with the dielectric inner spacer.

2. The device of claim 1, further comprising an interlayer dielectric (ILD) layer over the etch stop layer.

3. The device of claim 1, further comprising:
   a fin dielectric layer extending from the substrate along a sidewall of the fin, the fin dielectric layer contacting the dielectric inner spacer and the isolation structure.

4. The device of claim 1, wherein the semiconductor layer is a first semiconductor layer, further comprising:
   a second semiconductor layer over the first semiconductor layer,
   wherein the first portions of the dielectric inner spacer are disposed vertically between the first and the second semiconductor layers.

5. The device of claim 1, wherein a top surface of the isolation structure is above a bottommost surface of the dielectric inner spacer.

6. The device of claim 1, wherein the dielectric inner spacer wraps around the source/drain feature.

7. The device of claim 1, wherein the semiconductor layer has a first thickness adjacent the source/drain feature and a second thickness positioned further away from the source/drain feature, the second thickness being different than the first thickness.

8. The device of claim 7, wherein the gate dielectric wraps around a first portion of the semiconductor layer having the second thickness without wrapping around a second portion of the semiconductor layer having the first thickness.

9. A device comprising:
   a fin protruding from a substrate and disposed between portions of an isolation structure;
   a semiconductor layer over the fin;
   a gate dielectric wrapping around the semiconductor layer;
   a gate electrode wrapping around the gate dielectric disposed on the semiconductor layer;
   a source/drain feature interfacing with the semiconductor layer; and
   a dielectric inner spacer having first portions contacting side surfaces of the source/drain feature and a second portion contacting a bottom surface of the source/drain feature; and
   an etch stop layer over and in direct contact with the source/drain feature.

10. The device of claim 9, further comprising an interlayer dielectric (ILD) layer over the etch stop layer.

11. The device of claim 9, further comprising a fin dielectric layer extending from the substrate along a sidewall of the fin, the fin dielectric layer contacting the dielectric inner spacer and the isolation structure.

12. The device of claim 11, wherein the fin dielectric layer includes a top portion above a top surface of the isolation structure, and the top portion of the fin dielectric layer is disposed vertically between the source/drain feature and the isolation structure.

13. The device of claim 12, wherein the etch stop layer, the top portion of the fin dielectric layer, and the second portion of the dielectric inner spacer wrap around the source/drain feature.

14. The device of claim 9, wherein a top surface of the isolation structure is above a bottommost surface of the dielectric inner spacer.

15. A device comprising:
   a fin protruding from a substrate and disposed between portions of an isolation structure;
   a semiconductor layer over a first portion of the fin;
   a gate dielectric wrapping around the semiconductor layer;
   a gate electrode wrapping around the gate dielectric disposed on the semiconductor layer;
   a source/drain feature interfacing with the semiconductor layer; and
   a dielectric inner spacer layer having a bottom portion disposed between the source/drain feature and the substrate and directly contacting the source/drain feature and the substrate.

16. The device of claim 15, wherein the dielectric inner spacer has a top portion disposed on top and directly contacting the source/drain feature.

17. The device of claim 15, wherein the semiconductor layer is a bottommost semiconductor layer of a stack of semiconductor layers, and the bottom portion of the dielectric inner spacer layer directly contacts a bottom surface of the semiconductor layer.

18. The device of claim 16, wherein the semiconductor layer is a first semiconductor layer, the gate dielectric is a first gate dielectric, and the gate electrode is a first gate electrode, further comprising:
   a second semiconductor layer over a second portion of the fin;
   a second gate dielectric wrapping around the second semiconductor layer; and
   a second electrode wrapping around the second gate dielectric disposed on the second semiconductor layer,
   wherein the source/drain feature interfaces with the second semiconductor layer and is disposed between side surfaces of the first and second semiconductor layers.

19. The device of claim 18, wherein the bottom portion of the dielectric inner spacer layer directly contacts the first and the second semiconductor layers.

20. The device of claim 18, wherein the top portion of the dielectric inner spacer layer directly contacts the first and the second gate electrodes.

* * * * *